(12) United States Patent
Takayama et al.

(10) Patent No.: US 6,472,868 B1
(45) Date of Patent: Oct. 29, 2002

(54) MAGNETIC IMPEDANCE ELEMENT HAVING AT LEAST TWO THIN FILM-MAGNETIC CORES

(75) Inventors: Akio Takayama; Tamio Umehara; Akiyo Yuguchi; Hideki Kato; Akira Goto, all of Iwata-gun (JP)

(73) Assignee: Minebea Co., Ltd., Nagano-ken (JP)

( * ) Notice: Subject to any disclaimer, the term of this patent is extended or adjusted under 35 U.S.C. 154(b) by 0 days.

(21) Appl. No.: 09/366,547

(22) Filed: Aug. 4, 1999

(30) Foreign Application Priority Data

| Aug. 5, 1998 | (JP) | ............................................ 10-221766 |
| Mar. 31, 1999 | (JP) | ............................................ 10-091383 |
| Apr. 8, 1999 | (JP) | ............................................ 11-101309 |

(51) Int. Cl.$^7$ .................. G01R 33/02; G11B 5/127; G11B 5/33; G11B 5/31
(52) U.S. Cl. ................................. 324/249; 360/110
(58) Field of Search .................. 324/224, 249, 324/252, 260; 360/110, 113

(56) References Cited

U.S. PATENT DOCUMENTS

| 4,052,749 A | * 10/1977 | Nomura et al. ............ 360/123 |
| 4,918,824 A | * 4/1990 | Farrar ......................... 33/361 |
| 5,128,614 A | * 7/1992 | Schewe ..................... 324/249 |
| 5,473,491 A | * 12/1995 | Fujisawa et al. ........... 360/126 |
| 5,831,432 A | * 11/1998 | Mohri ......................... 324/249 |
| 5,889,403 A | * 3/1999 | Kawase ....................... 324/249 |

FOREIGN PATENT DOCUMENTS

| JP | 6-176930 | 6/1994 |
| JP | 6-347489 | 12/1994 |
| JP | 7-181239 | 7/1995 |
| JP | 7-248365 | 9/1995 |
| JP | 7-333305 | 12/1995 |
| JP | 8-75835 | 3/1996 |
| JP | 9-269084 | 10/1997 |

OTHER PUBLICATIONS

T. Morikawa et al. "Thin–Film GMI Elements with High Sensitivity" Japanese Applied Magnetic Institute Journal, vol. 20, No. 2, 1996, pp. 553–566.
"Electronic Technology", 1998–12, 66–69 Publication.

* cited by examiner

Primary Examiner—Edward Lefkowitz
Assistant Examiner—Reena Aurora
(74) Attorney, Agent, or Firm—Oliff & Berridge, PLC

(57) ABSTRACT

A magnetic impedance element including a substrate made of a non-magnetic material, a thin-film magnetic core formed on said substrate, and first and second electrodes disposed on both ends of said thin-film magnetic core in a longitudinal direction thereof, characterized in that said thin-film magnetic core is formed by laminating a plurality of magnetic films through non-magnetic thin-films.

2 Claims, 29 Drawing Sheets

F I G. 1
PRIOR ART $$\delta = \sqrt{\dfrac{2\rho}{\omega\mu\theta}}$$

F I G. 2
PRIOR ART $$|Z| = \dfrac{1}{\sqrt{2}}\dfrac{\rho}{W\delta}\sqrt{\dfrac{\cosh(2a/\delta)+\cos(2a/\delta)}{\cosh(2a/\delta)-\cos(2a/\delta)}}$$

$$\Delta M_0 = \frac{M_S H_{ex}}{2H_k} \cdot \frac{(H_k + H_o)\sqrt{(2H_k\ H_{ex})^2 - 1} - H_{ex}}{(H_k + H_o)\sqrt{(2H_k\ H_{ex})^2 - 1} + H_{ex}}$$

$$\cdots\cdots (6)$$

$$(\partial E / \partial \Delta \theta) = 0 \cdots\cdots\cdots (7)$$

F I G. 21
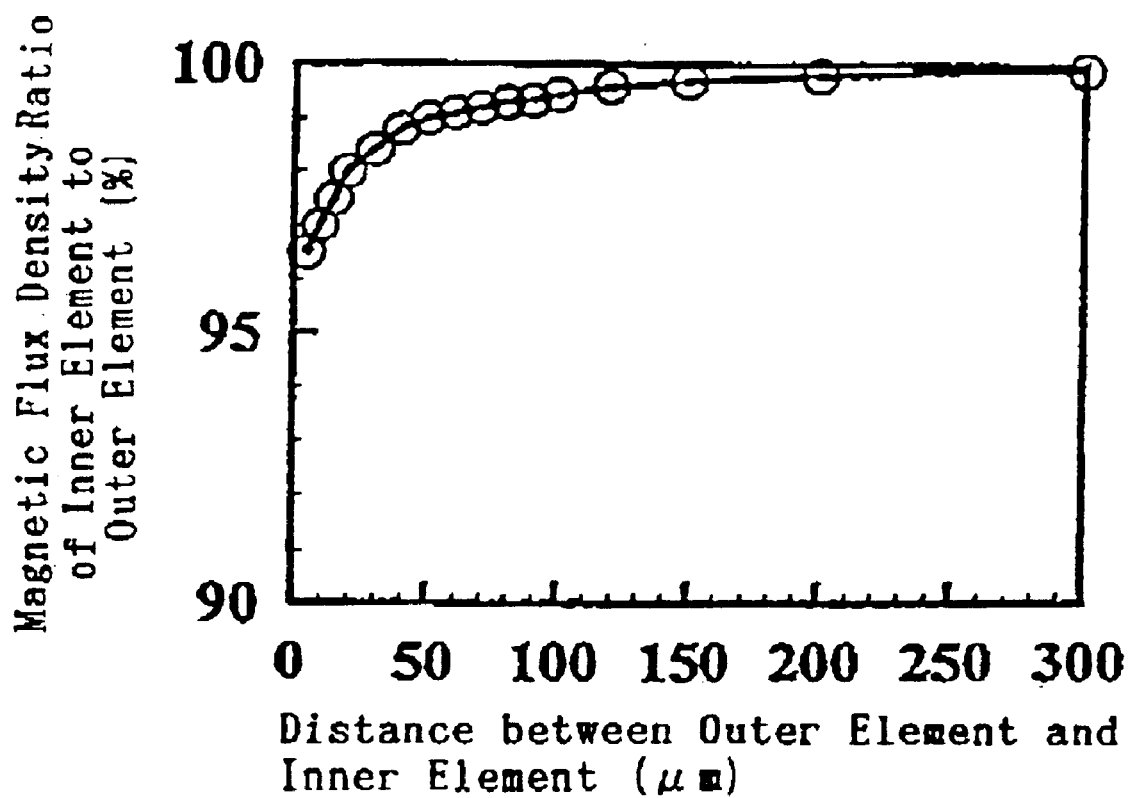

F I G. 26
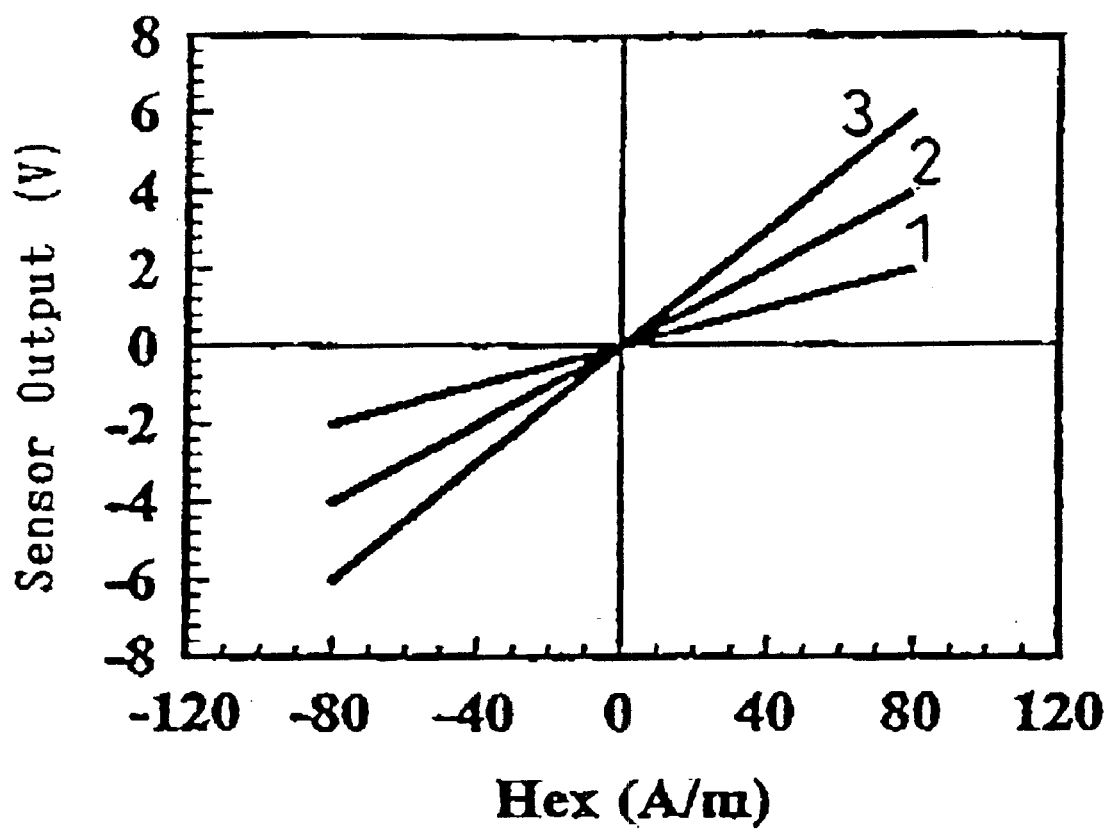

F I G. 27
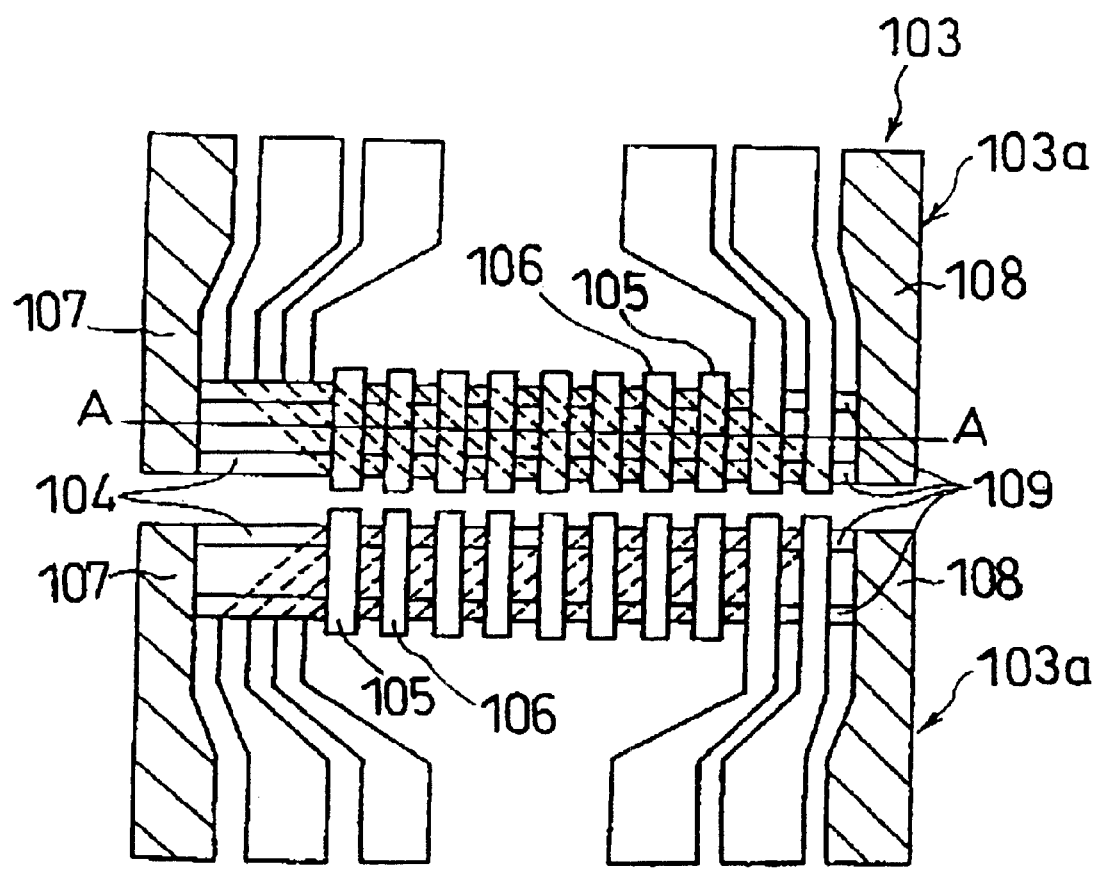

F I G. 30
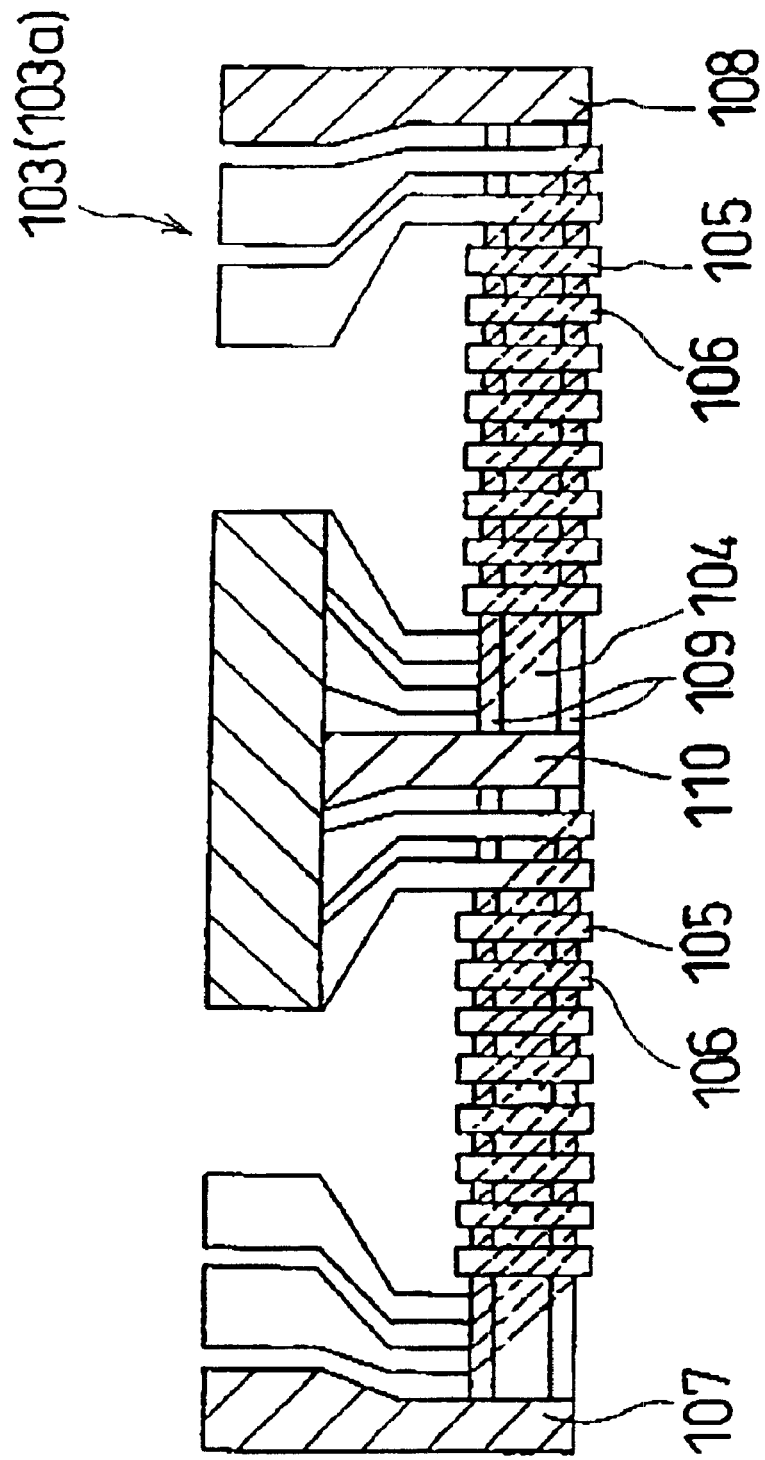

F I G. 36
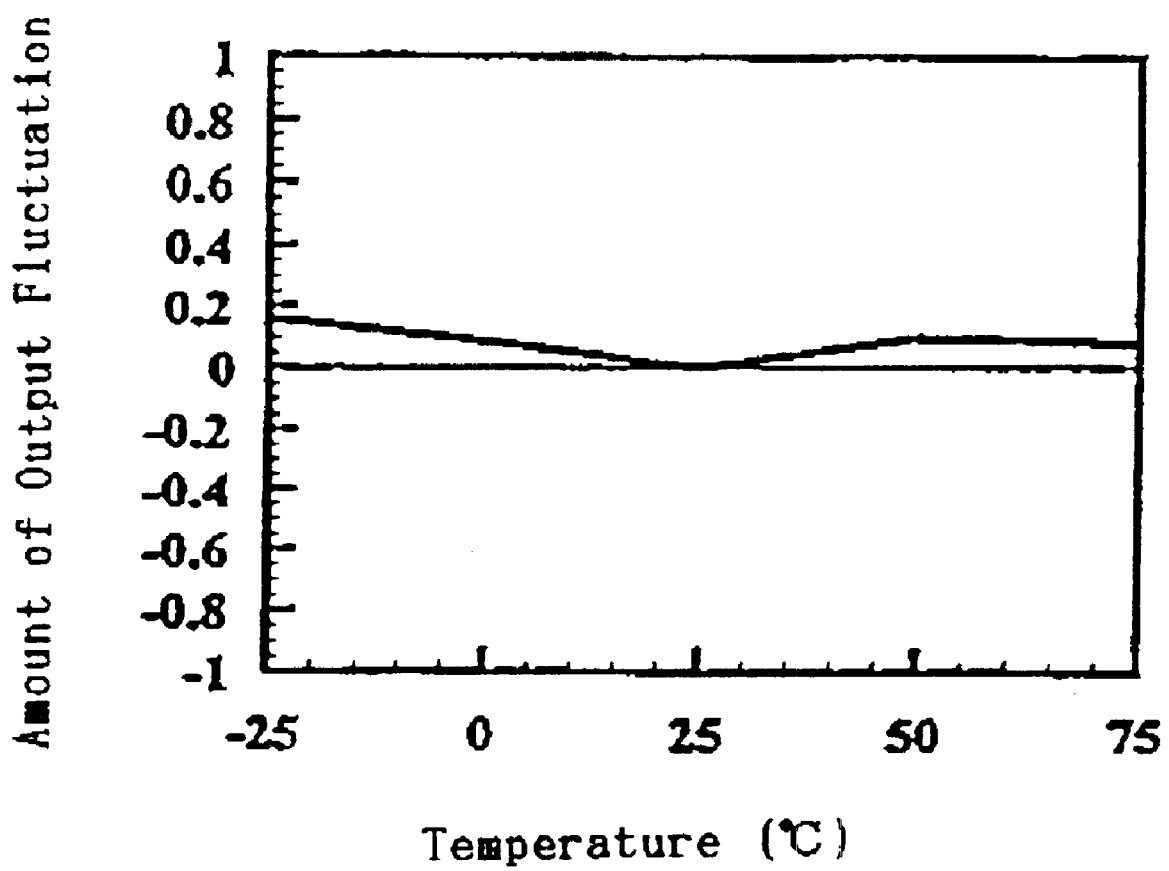

MAGNETIC IMPEDANCE ELEMENT HAVING AT LEAST TWO THIN FILM-MAGNETIC CORES

BACKGROUND OF THE INVENTION

1. Field of the Invention

The present invention relates to a magnetic-sensor, and more particularly to a magnetic impedance sensor which is a high-sensitive magnetic sensor.

2. Description of the Related Art

As information devices and measuring and control devices are being rapidly developed in recent years, demand of magnetic sensors which are low in size and costs and high in sensitivity and response speed have increased more and more. For example, in a hard disc device of an external memory device for a computer, a high performance has been advanced such that an induction type magnetic head of the bulk type has been changed to a thin-film magnetic head or a magnetic resistance effect (MR) head. Since in a rotary encoder which is a rotary sensor for use in a motor, a magnetic ring having a high magnetic density has been demanded, there has been required a magnetic sensor which is capable of detecting a fine surface magnetic flux with a high sensitivity instead of the conventional magnetic resistance effect (MR) sensor used. Also, demand of high-sensitive sensor which can be used for a non-destructive investigation or a bill investigation has increased more and more.

As representative magnetic detecting elements which are now being used, there are an induction type reproduction magnetic head, a magnetic resistance effect (MR) element, a flax gate sensor, a hall element and so on. Also, in recent years, there have been proposed magnetic sensors high in sensitivity using the magnetic impedance effect of an amorphous wire (refer to Japanese Patent Laid-open Publication No. Hei 6-176930, Japanese Patent Laid-open Publication No. Hei 7-181239, Japanese Patent Laid-open Publication No. Hei 7-333305) or the magnetic impedance effect of a magnetic thin-film (refer to Japanese Patent Laid-open Publication No. Hei 8-75835, Japanese Applied Magnetic Institute Journal, vol. 20,553 (1996)).

The induction type reproduction magnetic head suffers from such problems that a magnetic head per se becomes large-sized because a coil winding is required, to the contrary, that the sensitivity of detection is remarkably deteriorated in case the number of turns of coil is reduced for the purpose of making the magnetic head small. On the other hand, the magnetic resistance effect (MR) element using a ferromagnetic film is being employed. The MR element is so designed as to detect not a temporal variation in magnetic flux but the magnetic flux per se, to thereby advance the miniaturizing of the magnetic head. However, even in the existing MR element, for example, the MR element using a spin valve element, the rate of change in the electric resistance is small to the degree of 6% or less at the maximum, and the external magnetic field necessary for obtaining the resistance change of several % is large to the degree of 1.6 kA/m or more. Therefore, the magnetic resistance sensitivity is low to the degree of 0.001%/(A/m) or less. Also, in recent years, there has been found a giant magnetic resistance effect (GMR) due to an artificial lattice in which the rate of change in the magnetic resistance is several tens %. However, in order to obtain the resistance change of several tens %, the external magnetic field of several tens A/m is necessary, and therefore the practical use of the magnetic resistance element as a magnetic sensor has not been realized.

The flux gate sensor which is the conventional high-sensitivity magnetic sensor is so designed as to measure the magnetism by using the phenomenon in which the symmetric B-H characteristic of a high permeability magnetic core such as a permalloy is changed according to the external magnetic field, and has the high resolution and the high directivity of 1. However, the above flux gate sensor suffers from such problems that a large-sized magnetic core is required in order to enhance the sensitivity of detection, that it is difficult to reduce the dimensions of the entire sensor and that the power consumption is large.

The magnetic sensor using a hall element is a sensor using a phenomenon in which when a magnetic field is applied perpendicularly to a surface of the sensor into which a current flows, an electric field is developed in a direction perpendicular to both of the current flowing direction and the magnetic field applying direction, to thereby induce an electromotive force in the hall element. The hall element is advantageous in the costs but has such defects that the sensitivity of the magnetic field detection is low and that the temperature characteristic of the magnetic field sensitivity is low because the mobility of electrons or positive holes is changed by diffusion of lattices within the semiconductor due to thermal vibrations to a change of temperature since the hall element is made of semiconductor such as Si or GaAs.

Japanese Patent Laid-open Publication No. Hei 6-176930, Japanese Patent Laid-open Publication No. Hei 7-181239 and Japanese Patent Laid-open Publication No. Hei 7-333305 have proposed therein magnetic impedance elements by which a great improvement in the magnetic field sensitivity has been realized. The magnetic impedance element is a magnetic impedance element that has a basic principle in which only a voltage caused when a circumferential magnetic flux changes as a time elapses, which is produced when a current which varies as a time elapses is supplied to a magnetic line is detected as a change caused by the externally applied magnetic field. FIG. 16 shows an example of the magnetic impedance element. In the magnetic impedance element 1 of FIG. 16, an amorphous wire (a wire which has been tension-annealed after having been drawn) which is made of FeCoSiB or the like and about 30 $\mu$m in the diameter of exciting distortion is employed as a magnetic line 2. FIG. 17 is a graph showing the applied magnetic field dependency of the wire (for example, the magnetic line 2 in FIG. 16) with respect to the impedance change. Even in a wire having a small dimension of about 1 mm in length, when a high-frequency current of about 1 MHz is supplied to the wire, the amplitude of a voltage across the wire changes with the high sensitivity of about 0.1% /(A/m) which is 100 times or more of the MR element.

As the magnetic sensor, there has been demanded a high-sensitive magnetic sensor which is small in size, low in the costs and excellent in the linearity and the temperature characteristic of an output to the detected magnetic field. The magnetic sensor using the magnetic impedance effect of the amorphous wire exhibits the magnetic field detection characteristic of a high sensitivity. Also, Japanese Patent Laid-open Publication No. Hei 6-176930 and Japanese Patent Laid-open Publication No. Hei 6-347489 disclose that the application of a bias magnetic field allows the linearity of the dependency of the applied magnetic field on the impedance change to be improved; and that a negative feedback coil is wound on the amorphous wire, and a current proportional to a voltage between both ends of the amorphous wire is supplied to the coil to conduct negative feedback, thereby being capable of providing a sensor (high-sensitive magnetic impedance element) which is excellent in linearity and uniform in the magnetic field detection sensitivity with respect to the temperature change of the sensor section.

However, because the high-sensitive magnetic impedance element is formed of the amorphous wire the diameter of which is about 30 μm, it is not proper for fine machining, thereby making it difficult to provide a super-miniaturized magnetic detecting element. Also, since both of the bias coil and the negative feedback coil must be prepared by winding a thin copper wire, there is a limit of miniaturizing the high-sensitive magnetic impedance element, and there also arises a problem from the viewpoint of productivity such that the soldering property of the electrode is low since an oxide film is formed on the surface of the wire.

In addition, if the length of the element is lengthened in order to increase the impedance of the element for the purpose of obtaining a large sensor output, it is not proper for the miniaturization of the magnetic sensor. On the other hand, there is proposed that the wire is bent in a zigzag manner for use. However, in this case, since the wire made of a magnetic material is bent, the magnetic characteristic is deteriorated by a strain stress with the result that a sensor output is remarkably degraded. Also, there is proposed that a wire is divided into a plurality of pieces, the divided wires are disposed in parallel and electrically connected in series. However, in this case, there arises a problem of productivity such as a problem of electrode soldering.

On the other hand, as an attempt to miniaturize the magnetic impedance element, there has been proposed a magnetic impedance element using a magnetic thin-film in Japanese Patent Laid-open Publication No. Hei 8-75835, by which the element is going to be miniaturized. Also, the present inventors have proposed a miniaturized magnetic impedance element in which a thin-film coil is wound around a thin-film magnetic core three-dimensionally to provide a bias coil and a negative feedback coil in Japanese Patent Application No. Hei 9-269084. However, the magnetic film of those proposed elements is of a single-layer structure.

In this case, if the variation amount ΔZ/Z of the impedance and the width and the thickness of the element are kept constant in order to take a large sensor output, that is, in order to take a large variation amount ΔZ of the impedance, the length of the element must be lengthened. For that reason, there arises such a problem that the entire chip size becomes large.

Although the details will be described with reference to embodiments of the present invention, a magnetic domain structure shown in FIG. 3A is ideal, and in fact, when a uniaxial anisotropy is given in the widthwise direction of a single-layer thin-film pattern, a diamagnetic field is developed in the widthwise direction, and in order to minimize the diamagnetic energy, the magnetic domain structure becomes a state where the magnetic vector is closed as shown in FIG. 5. However, when the magnetization vector is directed to the longitudinal direction of the thin-film pattern, since a magnetic permeability $\mu\theta$ in the widthwise direction due to the external magnetic field Hex is hardly changed, the MI effect becomes very small. In other words, the MI effect of the 90° magnetic domain portion shown in FIG. 5 is very small so that the MI effect of the entire thin-film becomes small.

Also, as shown in FIG. 3 on pages 66 to 69 of "Electronic Technology" (Nikkan Kogyo Shinbunsha) 1992-December, there has been proposed a magnetic impedance (MI) element in which the length of a magnetic core is lengthened by bending a magnetic thin-film in a zigzag manner. However, in this structure, a magnetic domain structure at curved portions is complicated, and when a magnetic field is applied to the magnetic impedance element from the external, the magnetic walls of the curved portions cause noises due to a rapid change of the output voltage from the element which is caused by Barkhausen jump which ununiformly moves.

Further, there has been proposed a magnetic sensor which is structured such that a pair of magnetic detecting sections each of which is made up of an amorphous wire and a coil for applying a bias magnetic field to the wire are disposed in parallel to conduct differential drive, thereby improving the sensitivity, in Japanese Patent Laid-open Publication No. Hei 7-248365.

However, because the high-sensitive magnetic impedance element is formed of the amorphous wire which is about 30 μm in diameter, it is not proper for fine machining, as a result of which it is difficult to provide a super-miniaturized magnetic detecting element. Also, since both of a bias coil and a negative feedback coil must be prepared by winding a thin copper wire, there is a limit of miniaturizing the high-sensitive magnetic impedance element and there also arises a problem from the viewpoint of productivity such that the soldering property of the electrode is low since an oxide film is formed on the surface of the wire. In particular, as disclosed in Japanese Patent Laid-open Publication No. Hei 7-248365, in case of the differential drive, because two magnetic detecting elements are employed, the miniaturizing of the magnetic impedance element becomes increasingly difficult, and the productivity is also deteriorated. In addition, because the bias coil and the negative feedback coil must be wound around the respective amorphous wires, an interval between two wires requires a space for winding the coil, and the distance between those wires becomes long as much, thereby making it difficult to accurately detect a small local magnetic field.

On the other hand, as an attempt to miniaturize the magnetic impedance element, there has been proposed a magnetic impedance element using a magnetic thin-film in Japanese Patent Laid-open Publication No. Hei 8-75835, by which the element is going to be miniaturized. Also, the present inventors have proposed a miniaturized magnetic impedance element in which a thin-film coil is wound around a thin-film magnetic core three-dimensionally to provide a bias coil and a negative feedback coil in Japanese Patent Application No. Hei 9-269084. However, even in those inventions, two chips must be used in order to employ those inventions in a differential drive circuit. For that reason, because an interval between two thin-film magnetic cores becomes long, it is difficult to accurately detect a small local magnetic field similarly as in the Amorphous wire.

SUMMARY OF THE INVENTION

The present invention has been made in view of the above circumstances, and therefore an object of the present invention is to provide a high-sensitive magnetic sensor element which is small in size, low in the costs, high in output and excellent in the linearity and the temperature characteristic of an output detecting magnetic field with the above magnetic sensor In order to achieve the above object of the present invention, according to a first aspect of the present invention, there is provided a magnetic impedance element including a substrate made of a non-magnetic material, a thin-film magnetic core formed on said substrate, and first and second electrodes disposed on both ends of said thin-film magnetic core in a longitudinal direction thereof, characterized in that said thin-film magnetic core is formed by laminating a plurality of magnetic films through non-magnetic thin-films.

According to a second aspect of the present invention, there is provided a magnetic impedance element as defined in the first aspect of the present invention, characterized in that the thin-film magnetic core is formed by laminating the plurality of magnetic films, the thickness of which is equal to each other.

According to a third aspect of the present invention, there is provided a magnetic impedance element as defined in the first aspect of the present invention, characterized in that the thickness of the laminated magnetic films is ununiform.

According to a fourth aspect of the present invention, there is provided a magnetic impedance element as defined in the first aspect of the present invention, characterized in that the plurality of magnetic films are laminated through non-magnetic thin-films, and the total amount of products of the thickness and the magnetization amplitudes of the respective odd magnetic films is nearly equal to the total amount of products of the thickness and the magnetization amplitudes of the respective even magnetic films.

According to a fifth aspect of the present invention, there is provided a magnetic impedance element as defined in the first, second, third or fourth aspect of the present invention, characterized in that the non-magnetic films interposed between the respective magnetic films are made of an electrically conductive material.

According to a sixth aspect of the present invention, there is provided a magnetic impedance element as defined in the first, second, third or fourth aspect of the present invention, characterized in that the non-magnetic films interposed between the respective magnetic files are made of an insulator, and both end portions of the laminated magnetic films are electrically connected to each other at both end sides thereof.

According to a seventh aspect of the present invention, there is provided a magnetic impedance element as defined in the first aspect of the present invention, characterized in that said magnetic films that constitute the thin-film magnetic care are formed of a plating film made of at least one selected from a group consisting of NiFe, CoFe, NiFeP, FeNiP, FeCoP, FeNiCoP, CoB, NiCoB, FeNiCoB, FeCoB and CoFeNi.

According to an eighth aspect of the present invention, there is provided a magnetic impedance element as defined in the first aspect of the present invention, characterized in that said magnetic films that constitute the thin-film magnetic core are formed of an amorphous sputter film which is made of CoZrNb, FeSiB or CoSiB.

According to a ninth aspect of the present invention, there is provided a magnetic impedance element as defined in the first aspect of the present invention, characterized in that said magnetic films that constitute the thin-film magnetic core are formed of an NiFe sputter film.

In the invention thus structured, there can be provided the thin-film magnetic impedance element having a uniaxial anisotropy in the widthwise direction, in which the non-magnetic films are interposed in the magnetic thin-film to provide at least two layers of the magnetic thin-films, with the result that the magnetrostatic coupling allows the magnetization vector of the upper and lower magnetic films to be coupled to each other, thereby coming to a magnetic close state. With this state, the inner magnetic energy of the thin-film becomes minimized, and the thin-film having a two-layer structure is made up of only 180° magnetic domain, as a resultof which the MI effect is larger than that of the single-layer film. From the above viewpoints, the high-sensitive magnetic impedance element can be provided.

According to a tenth aspect of the present invention, there is provided a magnetic impedance element including a substrate made of a non-magnetic material and a thin-film magnetic core formed on said substrate and having electrodes an both ends of said thin-film magnetic core in a longitudinal direction thereof, characterized in that at least two of said thin-film magnetic cores are disposed in parallel, and said respective thin-film magnetic cores are electrically connected in series to each other.

With the above structure in which at least two of said thin-film magnetic cores are disposed in parallel, and in case said respective thin-film magnetic cores are electrically connected in series to each other. the impedance of the magnetic impedance element can be increased without increasing the entire chip size, thereby being capable of increasing a sensor output.

According to an eleventh aspect of the present invention, there is provided a magnetic impedance element as defined in the tenth aspect of the present invention, characterized in that said thin-film magnetic core has a thin-film bias coil and a thin-film negative feedback coil formed through an insulator, said thin-film bias coil and said thin-film negative feedback coil are alternately wound on the same plane at a given interval in the same direction and also they are wound by the same number of turns.

The above magnetic impedance element is structured in such a manner that the thin-film coil for bias and the thin-film coil for negative feedback are wound around the thin-film magnetic cores which are disposed in parallel through the insulator. The structure makes it possible to miniaturize the magnetic sensor and to make mass production. Also, because the thin-film coil produced with the above structure is excellent in coil efficiency, a required bias magnetic field is obtained with a small amount of current, and the linearity of an output to the magnetic field can be improved with a small amount of negative feedback. Also, since the thin-film coil for bias and the thin-film coil for negative feedback are alternately wound on the same plans, the bias magnetic field and the negative feedback magnetic field can be uniformly applied to the respective portions of the thin-film magnetic cores, to thereby stabilize the characteristics of the magnetic sensor.

According to a twelfth aspect of the present invention, there are provided two magnetic impedance elements from which a differential output is extracted in such a manner that two longitudinal thin-film magnetic cores formed on a substrate made of a non-magnetic material are disposed in parallel, first and second electrodes are disposed on both ends of the respective thin-film magnetic cores, and a thin-film bias coil and a thin-film negative feedback coil which are alternately wound on the same plane by the same number of turns in the same direction are disposed on said thin-film magnetic cores at a given interval through an insulator.

According to a thirteenth aspect of the present invention, there are provided two magnetic impedance elements as defined in the twelfth aspect of the present invention, characterized in that the respective thin-film magnetic cores of the two magnetic impedance elements formed on said non-magnetic substrate are formed of at least two thin-film magnetic cores which are disposed in parallel and electrically connected in series with each other.

According to a fourteenth aspect of the present invention, there are provided two magnetic impedance elements as defined in the twelfth aspect of the present invention, characterized in that in said two magnetic impedance elements, the respective one electrodes of the first and second electrodes of the thin-film magnetic cores, the thin-film bias coil electrode and the thin-film negative feedback coil electrode are commonly connected to each other.

According to a fifteenth aspect of the present invention, there are provided a magnetic impedance element in which a longitudinal thin-film magnetic core is formed on a substrate made of a non-magnetic material, first and second electrodes are disposed on both ends of said thin-film magnetic core in a longitudinal direction thereof, a third electrode is disposed at a middle point of said thin-film magnetic core and a thin-film bias coil and a thin-film negative feedback coil which are alternately wound on the same plane at the same number of turns in the same direction are disposed on said thin-film magnetic core at a given interval through an insulator, and a differential output is extracted from said first and second electrodes.

Because the above structure makes it possible to produce the magnetic sensor element for differential driving, a local magnetic field can be accurately detected, and also the magnetic sensor element for differential driving can be produced without increasing the entire chip size, thereby being capable of miniaturizing the magnetic sensor and making mass production.

According to a sixteenth aspect Of the present invention, there are provided a magnetic impedance element as defined in the fifteenth aspect of the present invention, characterized in that the respective one electrodes of the third electrode of said thin-film magnetic core and the electrodes of the thin-film bias coil and the thin-film negative feedback coil are commonly connected to each other.

The above structure can make an interval between the two thin-film magnetic cores that form a sensor head constant and narrow and can manufacture the magnetic sensor element for differential driving without increasing the entire chip size, thereby being capable of miniaturizing the magnetic sensor and making mass production.

According to a seventeenth aspect of the present invention, there are provided a magnetic impedance element as defined in any one of the first, second and twelfth to sixteenth aspects of the present invention, characterized in that said thin-film magnetic core is formed of a plating film made of at least one selected from a group consisting of NiFe, CoFe, NiFeP, FeCoP, CoB, NiCoB, FeNiCoB, FeCoB and CoFe.

According to an eighteenth aspect of the present invention, there are provided a magnetic impedance element as defined in any one of the first, second and twelfth to sixteenth aspects of the present invention, characterized in that said thin-film magnetic core is formed of an amorphous sputter film made of any one selected from CoZrNb, FeSiB and CoSiB or an NiFe sputter film.

Further, in the above magnetic impedance element, with the structure in which a portion that forms an earth electrode out of the electrode of the thin-film magnetic core, the electrode of the thin-film bias coil and the electrode of the thin-film negative feedback coil is made common, the number of process for connecting the magnetic impedance element to a sensor drive circuit due to wire bonding or the like in a sensor module manufacturing process can be reduced.

Also, because the thin-film coil manufactured with the above structure is excellent in coil efficiency, a required bias magnetic field is obtained with a small amount of current, and the linearity of an output to the magnetic field can be improved with a small Amount of negative feedback. Also, since the thin-film coil for bias and the thin-film coil for negative feedback are alternately wound, the bias magnetic field and the negative feedback magnetic field can be uniformly applied to the respective portions of the thin-film magnetic cores, to thereby stabilize the characteristics of the magnetic sensor.

The magnetic impedance element according to the present invention is structured in such a manner that the thin-film magnetic core is formed on the non-magnetic substrate, and the electrodes are disposed on both ends of the thin-film magnetic core In a longitudinal direction thereof. The magnetic impedance element according to the present invention is structured by laminating a plurality of magnetic films made of at least one of a group consisting of NiFe, CoFe, NiFeP, FeNiP, FeCoP, FeNiCoP, CoB, NiCoB, FeNiCoB, FeCoB and CoFeNi. Also, in the case where an amorphous material is selected as the magnetic film, any one of CoZrNb, FeSiB and CoSiB is selected.

The non-magnetic film is disposed between the magnetic films of the magnetic impedance element of the present invention, and the non-magnetic film is made of an electric conductive material or an insulator.

At least two thin-film magnetic cores are disposed an the non-magnetic substrate in parallel, the thin-film bias coil and the negative feedback coil are formed on the above thin-film core through the insulator, and those coils are alternately wound on the same plane in the same direction. The respective one electrodes of the electrodes provided on the above thin-film bias coil and the negative feedback coil are connected to each other. The present invention is structured such that two magnetic impedance elements are disposed to extract a differential output.

At least two thin-film magnetic cores which are disposed in parallel on the above non-magnetic substrate are electrically connected in series with each other.

BRIEF DESCRIPTION OF THE DRAWINGS

These and other objects, features and advantages of this invention will become more fully apparent from the following detailed description taken with the accompanying drawings in which:

FIG. 1 is an equation diagram representative of a skin depths $\delta$;

FIG. 2 is an equation diagram representative of the impedance of a thin-film MI element;

FIG. 21 is a characteristic graph representative of the magnetic flux density of an inner element to a distance of magnetic flux between an outer element and the inner element when three thin-film MI magnetic cores are disposed in parallel and a uniform magnetic field is applied to those elements, by %.

FIG. 26 is a graph showing the output voltage characteristic of the magnetic field detection magnetic sensor shown in FIG. 8;

FIG. 27 is a plan view schematically showing a magnetic impedance element (thin-film MI sensor) in accordance with another embodiment of the present invention:

FIG. 30 is a plan view schematically showing a magnetic impedance element (thin-film MI sensor) in which the earth terminal of the thin-film MI sensor with the structure shown in FIG. 29 is commonly used;

FIG. 36 is a graph showing the temperature-to-output fluctuation characteristic of the magnetic field detection magnetic sensor in accordance with the present invention.

DETAILED DESCRIPTION OF THE PREFERRED EMBODIMENTS

Hereinafter, a description will be given in more detail of preferred embodiments of the present invention with reference to the accompanying drawings.

The magnetic impedance effect (MI effect) is directed to a phenomenon in which when a high-frequency current is supplied to a magnetic substance of the high magnetic permeability, an impedance between both ends thereof varies according to an external magnetic field applied to the current supply direction. In other words, the magnetic impedance effect is caused by the fact that the impedance Z due to the internal inductance Li of the magnetic substance and the resistance Rw which increases together with the frequency f of an applied current due to the skin effect varies as a function of the magnetic permeability $\mu$ in the widthwise direction of the magnetic substance which varies by applying a magnetic field from the external.

$$Z = Rw(\mu\theta) + j\omega Li(\mu\theta) \quad (1)$$

In case of a thin-film, the resistance Rw of the thin-film in a high-frequency band (film thickness $d \gg 2\delta$) where the skin effect is remarkable can be represented by the following expression assuming that the d.c. resistance is Rdc.

$$Rw = Rdc(d/2\delta)$$

On the other hand, in case of $d \gg 2\delta$, the inductance can be represented by the following expression.

$$L = Li(2\delta/d)$$

where $\delta$ is a skin depth having a value shown in FIG. 1. Accordingly, the impedance of the thin-film is represented as follows:

$$Z = Rdc(d/2\delta) + j\omega Li(2\delta/d)$$

The impedance of the thin-film is obtained as shown in FIG. 2 assuming that the thickness of the thin-film d is $2a$, the width is W and the length is 1.

In this case, since the skin depth δ is obtained as shown in FIG. 1, the impedance Z of the thin-film is a function of the magnetic permeability $\mu\theta$.

Figure 3A:
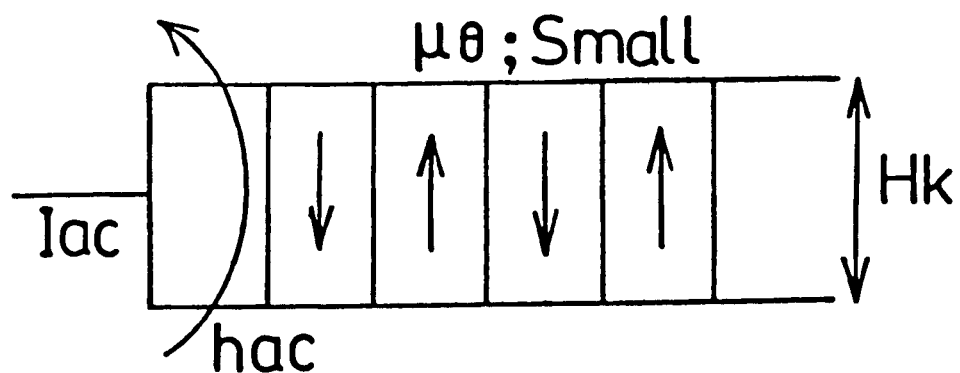
FIGS. 3A and 3B are model diagrams showing the magnetic domain structure of a magnetic core section of the thin-film MI element, respectively.

When a uniaxial anisotropy is given in the widthwise direction of the thin-film pattern as shown in FIG. 3A, the magnetic vector is toward the widthwise direction, and the magnetic domain structure is of the structure having 180° magnetic wall. By the way, in the case a high-frequency current flows in the longitudinal direction of the thin-film, although a high-frequency magnetic field is developed in the widthwise direction, the movement of the 180° magnetic wall is prevented by an eddy current damping. Also, because the high-frequency magnetic field direction and the magnetization vector direction are identical with each other, it is difficult that a rotating magnetization occurs. For that reason, a change in the magnetic flux is small, and the magnetic permeability $\mu\theta$ is small.

On the other hand, when the external magnetic field Hex is applied in the longitudinal direction of the thin-film pattern, the direction of the magnetization vector is inclined from the widthwise direction. Accordingly, since the rotation of the magnetization vector (rotating magnetization) occurs due to the magnetic field caused by the high-frequency current to change the magnetic flux, the magnetic permeability $\mu\theta$ becomes large. When the external magnetic field Hex becomes identical with the anisotropic magnetic field Hk of the film pattern, the magnetic permeability $\mu\theta$ becomes the largest, where the impedance Z becomes maximum. When the external magnetic field Hex becomes further large (Hex>Hk), the magnetization vector is fixed to Hex. Therefore, the rotation of the magnetization vector is restrained, and the magnetic permeability $\mu\theta$ becomes smaller, as a result of which the impedance Z becomes also smaller.

Figure 3B:
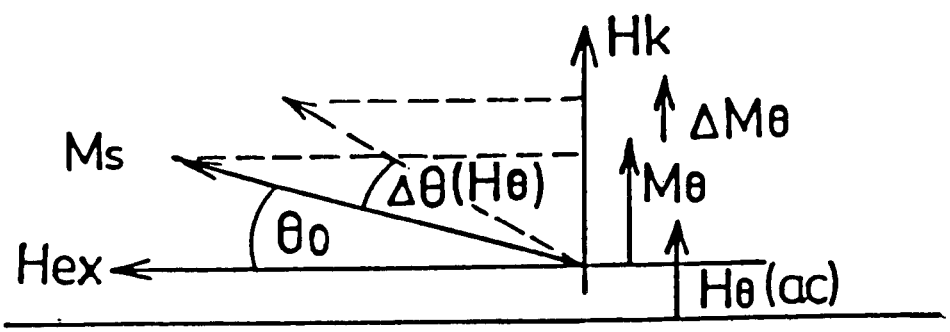

Those phenomenons will be proved on the basis of the rotating magnetization model with reference to FIG. 3B. In case of H θ=0, the rotating angle θ0 is determined under the energy minimizing condition represented by the following expression.

$$E0 = -Ku \cos 2(\pi/2 - \theta 0) - Ms \text{ Hex} \cos \theta 0 \qquad (3)$$

Therefore,

θ0=Hex/Hk is obtained from Hk=2 Ku/Ms. where assuming that a change of the rotating angle due to H θ is Δθ<<θ0, the magnetic change M in the widthwise direction is represented by the following expression.

$$\Delta M = Ms \cos \theta 0 \Delta \theta \qquad (4)$$

Also, the total energy including a term of Hθ is represented by the following expression.

$$E = -Ms(H\theta + Hk) \cos [\pi/2 - (\theta 0 + \Delta\theta)] - Ms \text{ Hex} \cos (\theta 0 + \Delta\theta) \qquad (5)$$

Figures 4, 5:
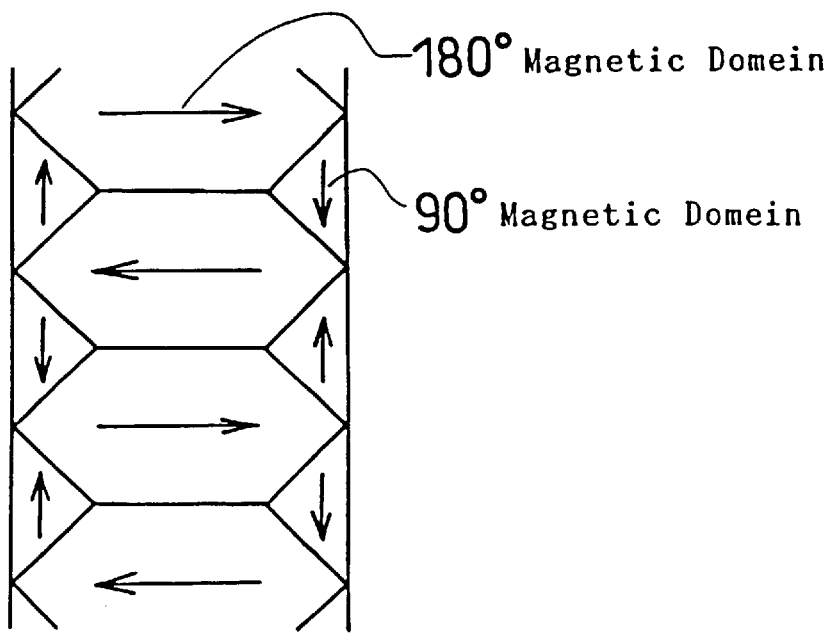
FIG. 4 is an equation diagram representative of the value of $\Delta MO$.
FIG. 5 is a model diagram showing the magnetic domain structure of a magnetic core section in accordance with one embodiment of the present invention.

If using the expression (5), Δθ is obtained from the expression (7) shown in FIG. 4 and substituted for the expression (4), the expression (6) shown in FIG. 4 is obtained.

Accordingly, in Hex<Hk, the magnetic permeability $\mu\theta$, that is, the impedance Z increases more as the magnetic field increases, and after the maximum value is taken in Hex=Hk, the impedance Z is reduced more as the magnetic field increases.

Also, when the magnetization vector is toward the longitudinal direction of the thin-film pattern, since the magnetic permeability $\mu\theta$ in the widthwise direction due to the external magnetic field Hex hardly changes, the MI effect becomes very small.

By the way, a magnetic domain structure shown in FIG. 3A is ideal, and in fact, when a uniaxial anisotropy is given in the widthwise direction of a single-layer thin-film pattern, a demagnetizing field is developed in the widthwise direction, and in order to minimize the demagnetizing field energy, the magnetic domain structure becomes a state where the magnetization vector is closed as shown in FIG. 5. With this magnetic domain structure, the internal magnetization energy of the magnetic thin-film becomes minimum and stabilized.

However, as described above, when the magnetization vector is directed to the longitudinal direction of the thin-film pattern, since a magnetic permeability $\mu\theta$ in the widthwise direction due to the external magnetic field Hex is hardly changed, the MI effect becomes very small. In other words, the MI effect of the 90° magnetic domain portion shown in FIG. 5 is very small so that the MI effect of the entire thin-film becomes small.

Figure 6:
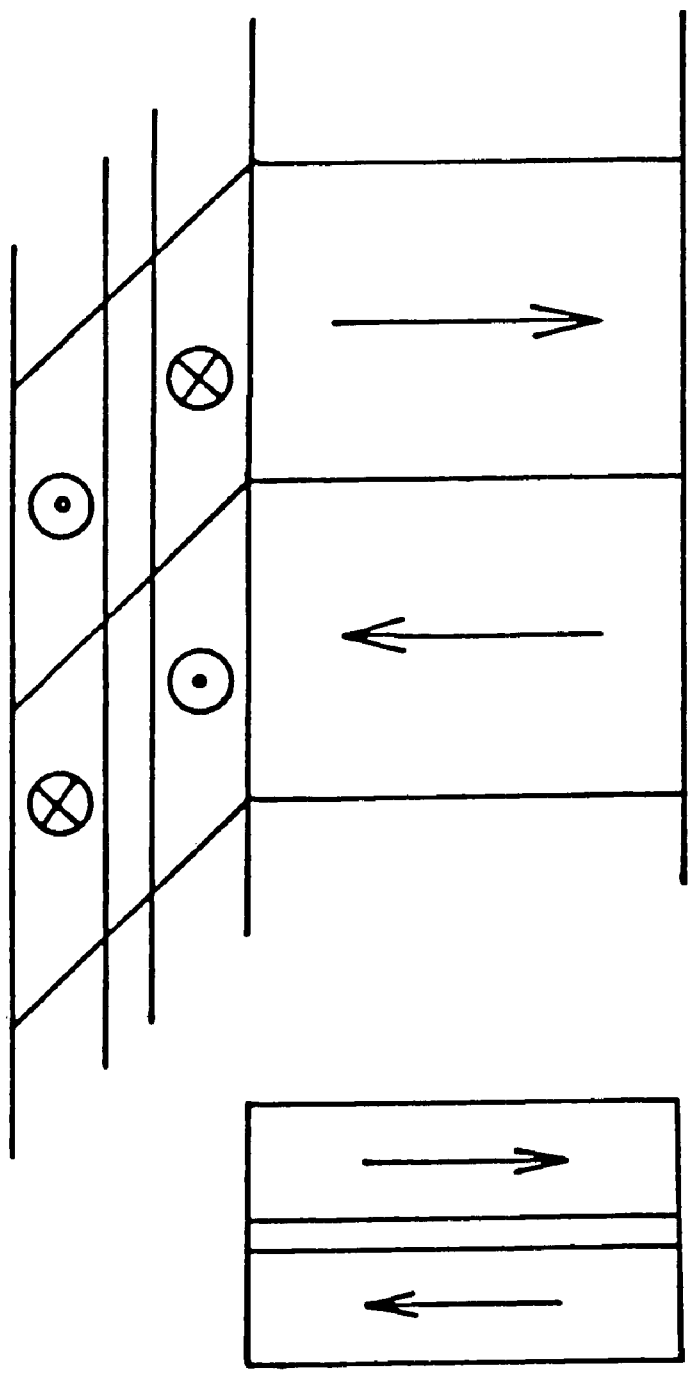
FIG. 6 is a model diagram showing the magnetic domain structure of a magnetic core section in accordance with another embodiment of the present invention.

As shown in FIG. 6, a uniaxial anisotropy is given in a widthwise direction, and a non-magnetic film is inserted into the middle of the magnetic thin-film to structure two layers of the non-magnetic film with the result that the magnetrostatic coupling allows the magnetization vector of the upper and lower magnetic films to be coupled to each other, thereby coming to a magnetic closed state. With this state, the internal magnetization energy of the thin-film becomes minimized and stabilized. Also, the thin-film having a two-layer structure is made up of only 180° magnetic domain, as a result of which the MI effect is larger than that of the single-layer film, The magnetic film of the magnetic impedance element shown in FIG. 6 may be formed of an amorphous sputter film made of CoZrNb, FeSiB, CoFeB, or the like or a soft magnetic film such as an NiFe sputter film. For example, an example in which the NiFe sputter film is used will be described. An NiFe sputter film is formed in thickness of about 2.5 $\mu$m on a non-magnetic and insulating substrate, a non-magnetic film made of Ti or the like is further formed in thickness of about 10 nm on the sputter film. and an NiFe sputter film is finally formed in thickness of about 2.5 $\mu$m on the non-magnetic film. Thereafter, a photoresist pattern having a predetermined magnetic core configuration is formed on the thin-film. The thin-film is etched by etching means such as ion mealing while the photoresist pattern is used as an etching mask. Then, the photoresist pattern is removed by an organic solvent or the like, thus producing a magnetic impedance element.

The thickness of the non-magnetic film thus produced is required to be set to the degree where the exchange coupling of the upper and lower magnetic films can be blocked, and the thickness may be about 10 nm or more In addition, because the MI element employs the magnetic permeability dependency of the skin effect, it is desirable to use an electrically conductive thin-film made of Ti, Ta, Cu, Al, Au, Ag, Pt or the like as the intermediate non-magnetic film. Incidentally, in the case where the non-magnetic film is formed of an insulating thin-film, both end portions of the laminated magnetic films are electrically connected to each other at both end sides so that the laminated magnetic films are electrically connected in parallel.

Also, in order to couple the magnetization vectors of the upper and lower magnetic films together to minimize the entire internal magnetic energy, it is necessary to make the total amounts of the magnetizations of the upper and lower magnetic films equal to each other. To achieve this, it is necessary to satisfy the condition of. Ms1×t1=Ms2×t2 assuming that the magnetization of the upper magnetic film is Ms1, the thickness of the upper magnetic film is t1, the magnetization of the lower magnetic film is Ms2 and the thickness of the lower magnetic film is t2.

Figure 7:
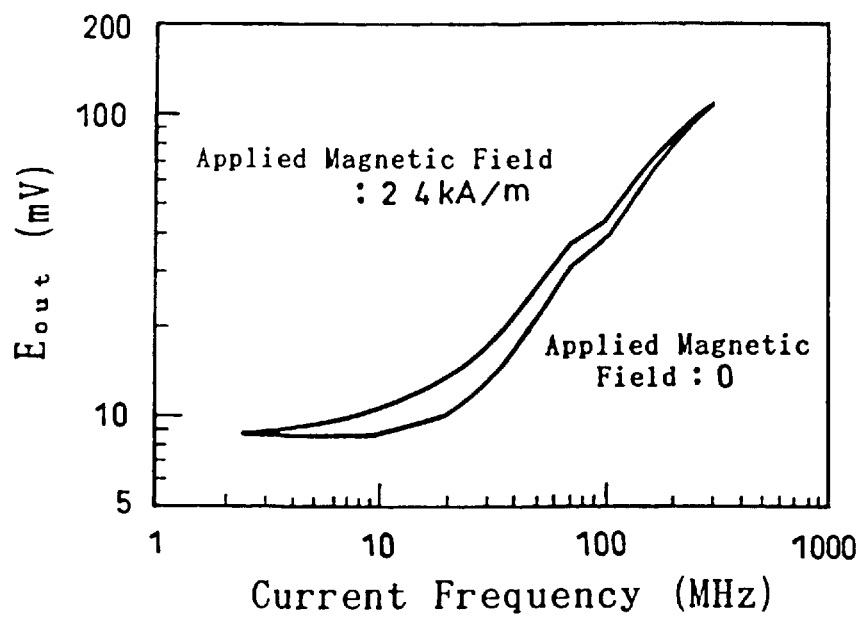
FIG. 7 is a characteristic graph showing the supply current frequency of the thin-film MI element.

FIG. 7 is a graph showing the frequency characteristic of the sensor both-end electrode E (E=Z * I) when an external magnetic field (Hex) of 0 and 2.4 kA/m is applied in the longitudinal direction of the element to a thin-film magnetic impedance element produced with the structure of two NiFe sputter films about 2.5 μm in thickness while Ti is used as the intermediate film. A difference ΔE of E at the time of Hex=0 and Hex=2.4 kA/m was maximum when the frequency of the supply current is about 20 MHz.

Figure 8:
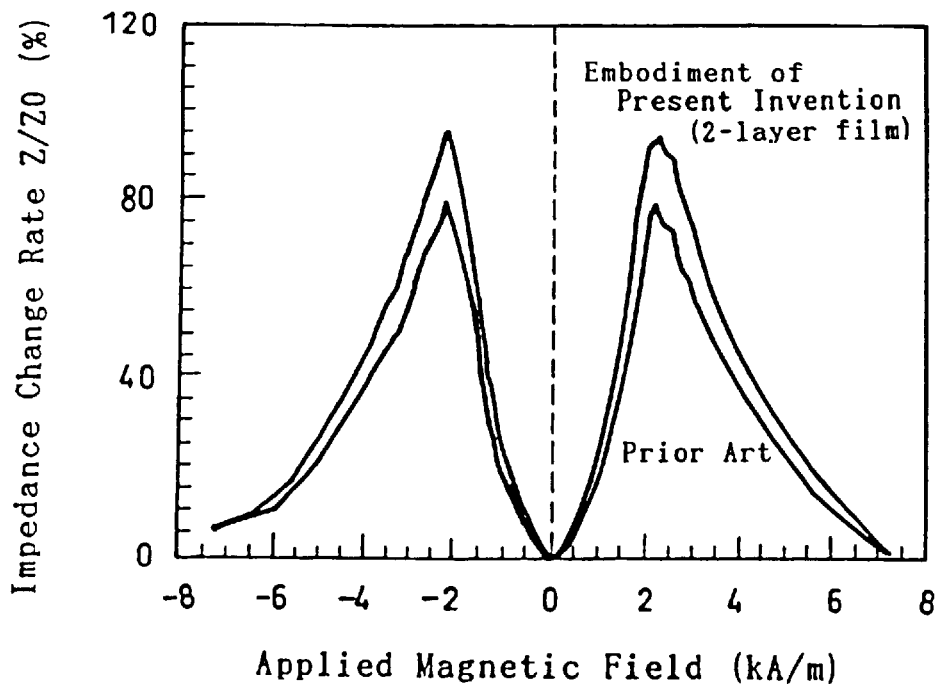
FIG. 8 is a characteristic graph showing an impedance change rate of the thin-film MI element to the applied magnetic field.

FIG. 8 shows a dependency of the impedance change rate on the applied magnetic field (Hex) when the frequency of applied current of 20 MHz (10 mA) is constantly applied to a two-layer thin-film magnetic impedance element (2.5 μm×2-layer) made of NiFe. For comparison, the characteristic of a single-layer thin-film magnetic impedance element (5 μm) made of NiFe is shown together. As the applied magnetic field increases, the change rate ΔZ/Z0 of the impedance increases more, and ΔZ/Z0 becomes maximum when the applied magnetic field is the anisotropy magnetic field Hk of the element, and ΔZ/Z0 reduces when Hex>Hk. Those results become the characteristic represented by the above-mentioned theoretical expression. Also, the change rate of the impedance of the two-layer film magnetic impedance element is large, that is, 90% as compared with that of the single-layer film magnetic impedance element being 75%. At this time, the change amount (magnetic field sensitivity) of the impedance per a unit applied magnetic field becomes maximum when Hex is about 1.6 kA/m and exhibits the magnetic field sensitivity of 0.08%/(A/m).

Also, a method of manufacturing the thin-film magnetic impedance element in accordance with another embodiment of the present invention will be described. The reverse configuration of a given thin-film magnetic core is prepared in a thin metal plate, and a non-magnetic substrate is masked with the metal plate as a sputter mask. Then, an NiFe sputter film is formed in thickness of about 2.5 μm, a non-magnetic film made of Ti or the like is formed in thickness of about 10 nm and a NiFe sputter film is further formed in thickness of about 2.5 μm, to manufacture a magnetic impedance element.

An embodiment in which a plating film made of any one of NiFe, CoFe, NiFeP, FeNiP, FeCoP, FeNiCoP, CoB, NiCoB, FeNiCoB, FeCoB, CoFeNi and so on is used as a magnetic film will be described. First, an NiFe sputter film having a thickness of about 50 nm is formed as a seed layer for plating. A photoresist pattern of the reverse pattern having a given coil configuration is formed on the seed layer, and an NiFe plating is embedded in thickness of about 2.5 μm between the photoresist pattern. Then, a non-magnetic metal made of Cu or the like is deposited in thickness of about 10 nm thereon through a plating method. Further, an NiFe plating is embedded in thickness of about 2.5 μm thereon. Thereafter, the photoresist pattern is removed by an organic solvent or the like, and a magnetic impedance element is formed by removing the seed layer of the NiFe plating film by etching. The magnetic impedance element is manufactured through the same process even when the plating film made of CoFeNi or the like is used as a thin-film magnetic core.

Also, all the thin-film magnetic cores manufactured in the above-mentioned methods improve the magnetic characteristics if they are subjected to a heat treatment during the rotating magnetic field and the static magnetic field after being manufactured.

In a multi-layer film of three layers or more, that is, in a structure where n-layers (n≧3) are laminated through non-magnetic thin-films, the non-magnetic films between the films are an electrically conductive material and when the total amount of products of the thickness and the magnetization amplitudes of the respective odd magnetic films is nearly equal to the total amount of products of the thickness and the magnetization amplitudes of the respective even magnetic films, the magnetization vector of the magnetic films of the respective layers makes magnetrostatic coupling, and the internal magnetization energy of the thin-film is minimized and stabilized. Also, the thin-film having the multi-layer structure which satisfies the above condition is structured by only 180° magnetic domain with the result that the MI effect becomes larger than that of the single-layer film.

Figure 9:
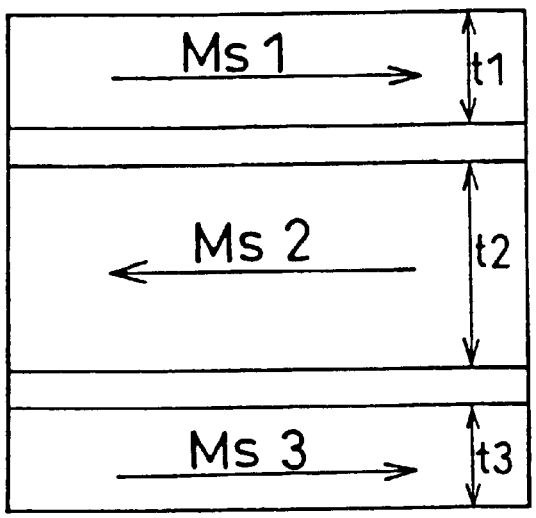
FIG. 9 is a model diagram showing the magnetic domain structure of a magnetic core section in accordance with further another embodiment of the present invention.

FIG. 9 shows an embodiment of a three-layer structure, and in this embodiment, assuming that the magnetization of the uppermost magnetic film is Ms1, the thickness of the uppermost magnetic film is t1, the magnetization of the second magnetic film is Ms2, the thickness of the second magnetic film is t2, the magnetization of the lowermost magnetic film is Ms3 and the thickness of the lowermost magnetic film is t3, when Ms1×t1 +Ms3×t3=Ms2×t2 is satisfied, the magnetization vectors of the respective magnetic layers make magnetrostatic coupling, and the thin-film is made up of only 180° magnetic domain.

Figure 10:
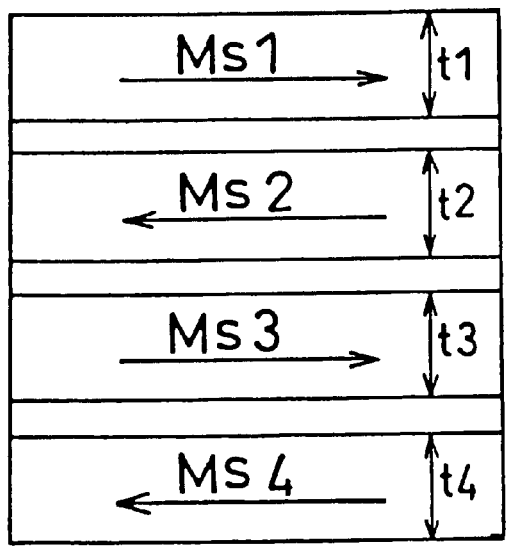
FIG. 10 is a model diagram showing the magnetic domain structure of a magnetic core section in accordance with further another embodiment of the present invention.

FIG. 10 shows an embodiment of a four-layer structure, and in this embodiment, assuming that the magnetization of the uppermost magnetic film is Ms1, the thickness of the uppermost magnetic film is t1, the magnetization of the second magnetic film is Ms2, the thickness of the second magnetic film is t2, the magnetization of the third magnetic film is Ms3, the thickness of the third magnetic film is t3, the magnetization of the fourth magnetic film is Ms4 and the thickness of the fourth magnetic film is t4, when Ms1×t1+Ms3×t3=Ms2×t2+Ms4×t4 is satisfied, the magnetization vectors of the respective magnetic layers make magnetrostatic coupling, and the thin-film is made up of only 180° magnetic domain.

Also, although being not shown, in case of an n-layer structure, assuming that the magnetization of the uppermost magnetic film is Ms1, the thickness of the uppermost magnetic film is t1, the magnetization of the second magnetic film is Ms2, the thickness of the second magnetic film is t2, . . . the magnetization of the n-th magnetic film is Msn and the thickness of the n-th magnetic film is tn, when it is satisfied that the total amount of products of the thickness and the magnetization amplitudes of the respective odd magnetic films is nearly equal to the total amount of products of the thickness and the magnetization amplitudes of the respective even magnetic films, the magnetization vectors of the respective magnetic layers make magnetrostatic coupling, and the thin-film is made up of only 180° magnetic domain.

Figure 11:
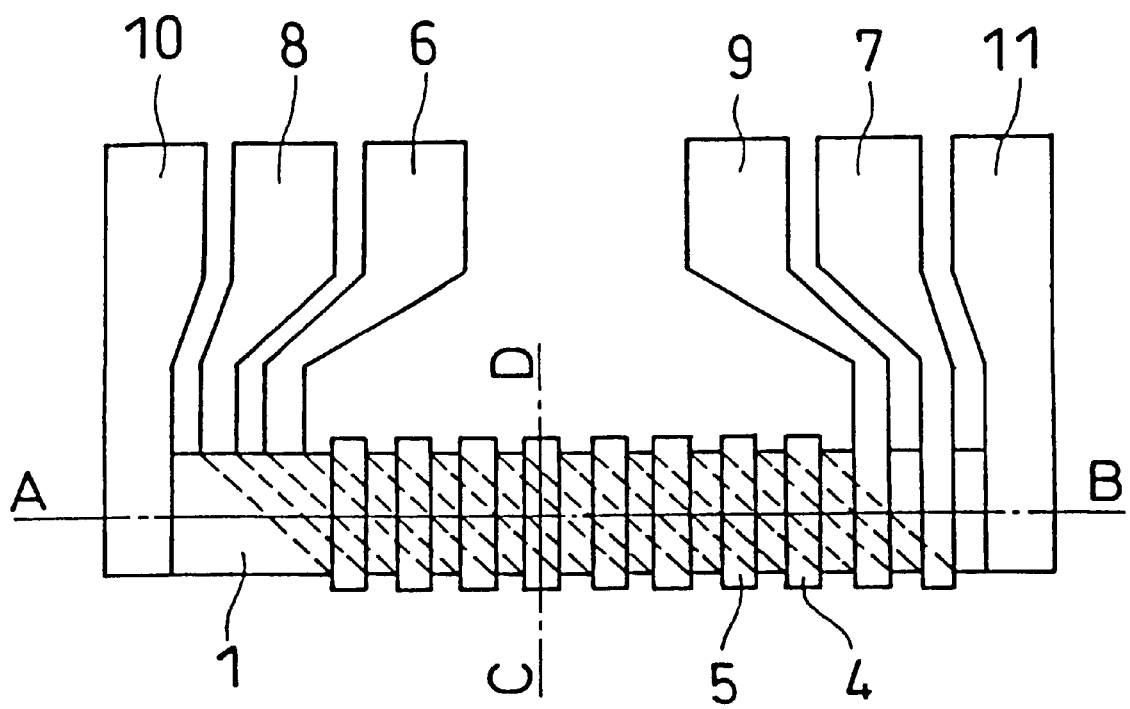
FIG. 11 is a schematic front view showing the structure of a thin-film magnetic impedance element used in the present invention.
Figure 12:
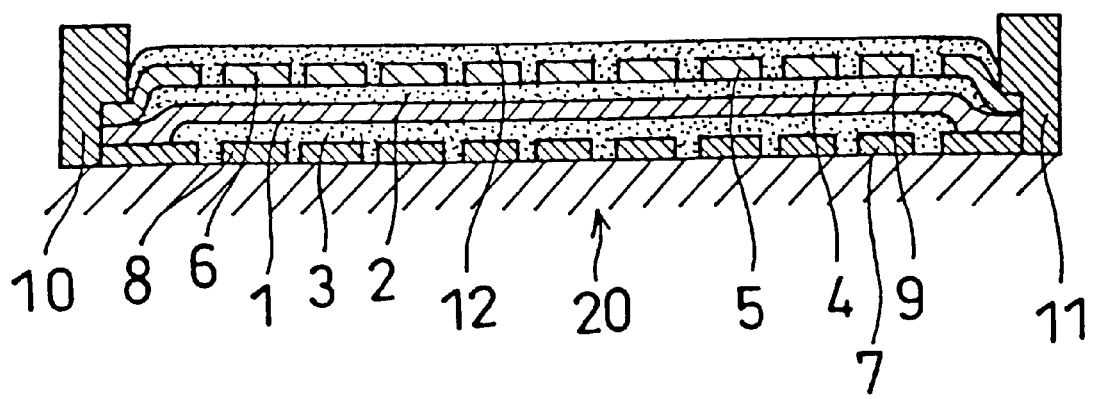
FIG. 12 is a cross-sectional view taken along line A–B of FIG. 11.
Figure 13:
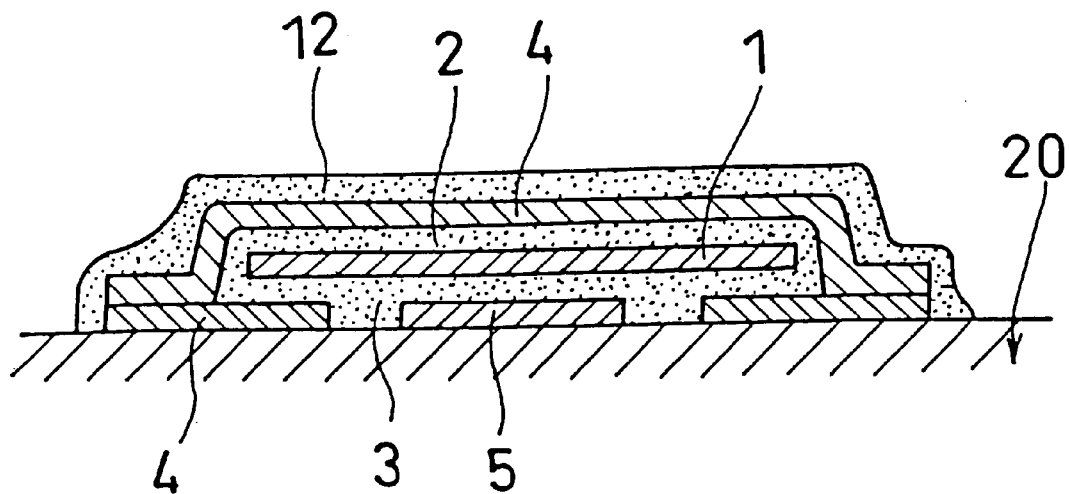
FIG. 13 is a cross-sectional view taken along line C–D of FIG. 11.

Subsequently, the characteristic of the thin-film magnetic impedance element which has been manufactured using a two-layer thin-film magnetic impedance element will be described. FIG. 11 is a schematic front view showing the structure of a thin-film magnetic impedance (MI) element used in the embodiment of the present invention, FIG. 12 is a cross-sectional view taken along line A–B of FIG. 11, and FIG. 13 is a cross-sectional view taken along line C–D of FIG. 11. Although the actual entire thin-film MI sensor is formed on a thin-film ceramic plate or a plate body such as a glass plate, such a plate is omitted from FIG. 11. Referring to FIGS. 11, 12 and 13, reference numeral 1 denotes an MI sensor plate which is a thin-film magnetic core shaped in a thin-film rectangular in plane configuration. The configuration of the thin-film magnetic core as the MI sensor plate is 20 μm in width, 5 μm in thickness and 500 μm in length. A bias coil 4 and a negative feedback coil 5 are alternately wound around the MI sensor plate 1 through insulating layers 2 and 3 in the same direction. Although being not accurately shown in the figures, the number of turns of those coils is 20, respectively. With the structure in which the coils for bias and negative feedback are alternately wound around the thin-film magnetic core on the same plane, a bias magnetic field and a negative feedback magnetic field can be uniformly applied to the respective portions of the magnetic core, to thereby improve the linearity of the sensitive characteristic as a magnetic sensor. Both ends of the bias coil 4 are connected with bias coil terminals 6 and 7, and both ends of the negative feedback coil 5 are connected with negative feedback coil terminals 8 and 9. Both ends of the MI sensor plate 1 are connected with MI sensor terminals 10 and 11. Those terminals are formed of Au metal thin-films, and those widened tip portions serve as pads for external wiring. Incidentally, reference numeral 12 denotes an insulating protective film that covers the entire MI sensor.

When the thin-film magnetic impedance element is used as a magnetic sensor, the operating point is brought to the maximum sensitivity, thereby being capable of improving the sensor sensitivity. For that reason, if a current is allowed to flow into the bias coil, a bias magnetic field is applied to the magnetic impedance element, thereby being capable of changing the operating point, and the application of the bias magnetic field of 1.6 kA/m to the magnetic core using the thin-film coil makes the magnetic field sensitivity maximum at a portion where the applied magnetic field is 0.

Figure 14:
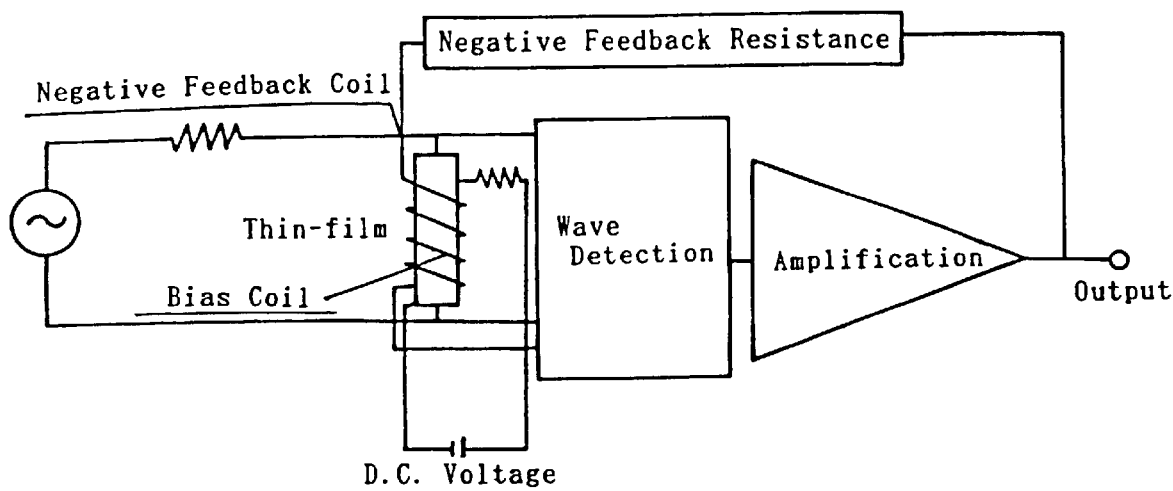
FIG. 14 is a circuit block diagram showing the output detection section of a magnetic sensor using the thin-film MI element according to the present invention.

On the other hand, in the case where the operating point is moved using the bias coil so that the magnetic field sensitivity becomes maximum when the applied magnetic field is 0, the linearity of a change of the impedance (a change in output) to the magnetic field is not satisfactory. As a method for improving the linearity, there is applied a method in which an output signal is fed back, and a magnetic field necessary only for correcting the non-linearity of the output to the magnetic field is applied to the thin-film magnetic core as the negative feedback magnetic field by using the negative feedback coil, thereby correcting the output signal to obtain the linearity. FIG. 14 is a block diagram showing an electronic circuit in an output detecting section of a linear magnetic field MI sensor. Due to this circuit, the operating point is moved to a point of the maximum sensitivity, the output signal is fed back and a negative feedback magnetic field is applied to the thin-film core, thereby enhancing the linearity of the characteristic of the sensitivity.

Figure 15:
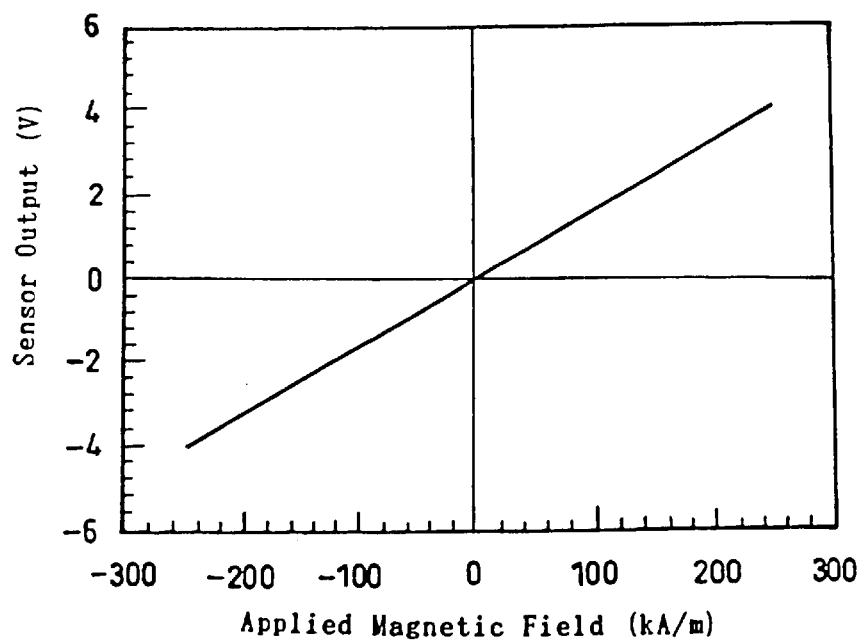
FIG. 15 is a characteristic graph showing the sensor output to the applied magnetic field in the circuit shown in FIG. 14.
Figure 16:
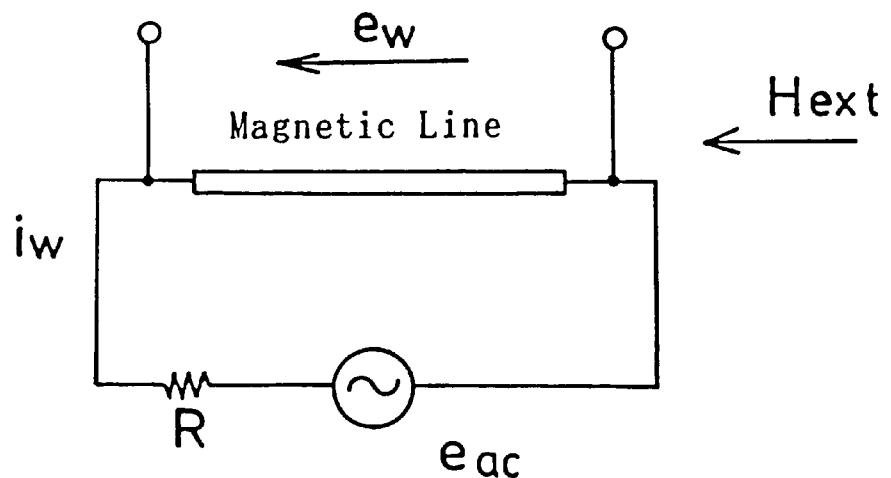
FIG. 16 is a circuit block diagram showing a conventional magnetic sensor using an MI element formed of a magnetic line.
Figure 17:
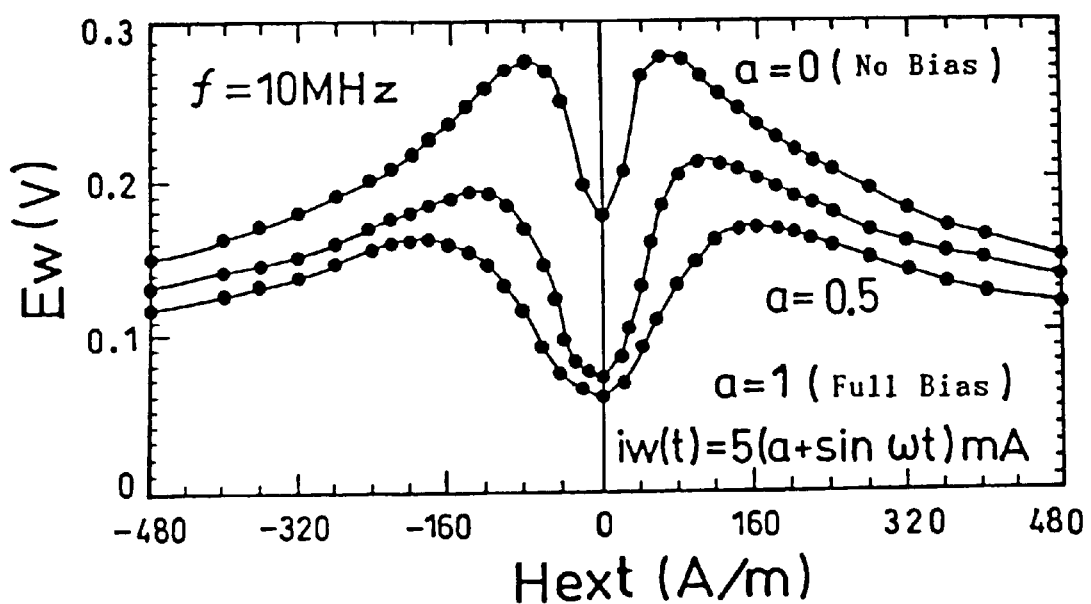
FIG. 17 is a characteristic graph showing the dependency of the applied magnetic field on the impedance change of the magnetic line shown in FIG. 16.

FIG. 15 shows a relation of the output voltage to the applied magnetic field when 1.6 kA/m in bias coil magnetic field and 50% in negative feedback ratio is effected by using the circuit shown in FIG. 14. In this example, the frequency of the supply current is 20 MHz, and the amplification degree of the output is 500 times. As shown in the figure, the excellent linearity is exhibited within the measured magnetic field of ±240 μA/m, and the magnetic resolution of $10^{-4}$ A/M is exhibited. Those results are excellent characteristics as the linear magnetic field sensor.

Subsequently, a description will be given of another embodiment of the present invention in which two or more thin-film magnetic cores are disposed in parallel on a substrate made of a non-magnetic substance and connected in series with each other. This embodiment corresponds to the inventions of claims 10 to 11.

Figure 18:
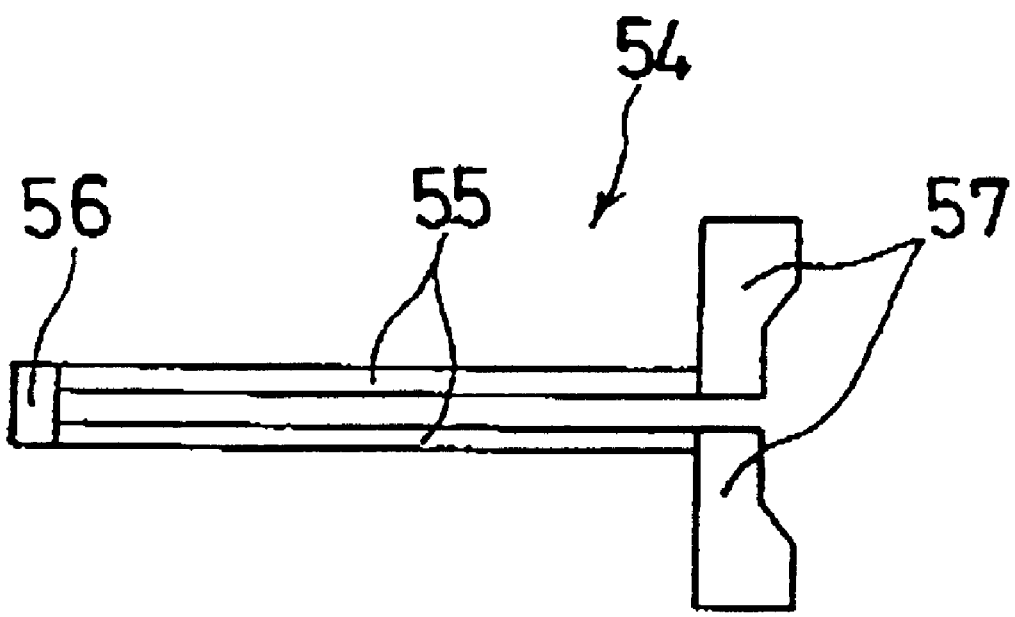
FIG. 18 is a plan view showing the main portion of the magnetic impedance element from which a coil and an insulating film are removed in accordance with another embodiment of the present invention.

FIG. 18 is a schematic view showing the structure of a thin-film MI sensor 54 (magnetic impedance element) in accordance with this embodiment. In the thin-film MI sensor 54, two thin-film MI magnetic cores 55 are disposed in parallel at an interval of 20 μm, and the respective cores 55 are electrically coupled in series with each other by a non-magnetic conductor 56 made of Cu or the like. In this example, because the total length of the magnetic core (thin-film MI magnetic core 55) can be lengthened double without lengthening the overall length of the sensor element (thin-film MI sensor 54), the impedance becomes twice, and because an external magnetic field is uniformly applied to two magnetic cores the sensor sensitivity (the sensitivity of the thin-film MI sensor 4) becomes double. The core 55 is formed on the substrate made of a non-magnetic substance not shown (refer to a non-magnetic substrate 70 in FIG. 24).

In FIG. 18, the thin-film MI magnetic core 55 is formed of a plating film (soft magnetic film) made of at least one kind selected from a group consisting of NiFe, CoFe, NiFeP, FeNiP, FeCoP, FeNiCoP, CoB, NiCoB, FeNiCoB, FeCoB and CoFe. The thin-film MI magnetic core 55 may be formed of an amorphous sputter film made of any one of CoZrNb, FeSiB and CoSiB, or an NiFe sputter film (soft magnetic film).

Subsequently, a manufacturing example when the NiFe plating film is used as the thin-film magnetic core (thin-film MI magnetic core 55) will be described.

First, an NiFe sputter film having a thickness of about 200 nm is formed as a seed layer for plating. A photoresist pattern of the reverse pattern having a given coil configuration is formed on the seed layer, and thereafter an NiFe plating is embedded in thickness of about 3 μm between the photoresist pattern. Then, after the photoresist pattern is removed by an organic solvent or the like, the seed layer of the NiFe sputter film is removed by etching to form the thin-film magnetic core. The thin-film magnetic core is manufactured through the same process even when a CoFeNi plating film is used as a thin-film magnetic core (thin-film MI magnetic core 55). The magnetic characteristics are improved if the magnetic impedance element is subjected to a heat treatment during the rotating magnetic field and the static magnetic field after the thin-film magnetic core has been manufactured.

Referring to FIG. 18, reference numeral 57 denotes an electrode for allowing a high-frequency current to flow in the thin-film MI element (thin-film MI sensor 4). Also, as described above, the non-magnetic conductor 56 made of Cu or the like is a conductor for electrically connecting two thin-film MI magnetic core 55 in series. However, the non-magnetic conductor 56 may be a non-magnetic low-resistant conductor made of Au, Al, or the like, A case in which the non-magnetic conductor 56 is made of Cu will be described. A Cu sputter film having a thickness of about 50 nm is formed as a seed layer for plating. Then, after a photoresist pattern of the reverse pattern having a given coil configuration has been formed on the seed layer, a Cu plating is embedded In thickness of about 3 μm into the photoresist pattern, and further after the photoresist pattern has been removed by an organic solvent or the like, the seed layer of the Cu sputter film is removed by etching to form the thin-film MI element.

Also, a lower-layer coil portion may be manufactured in the following manner. That is, the Cu sputter film is formed in thickness of about 3 μm, and thereafter a photoresist pattern having a coil configuration is formed. The Cu sputter film is etched by etching means such as ion sealing with the photoresist pattern as an etching mask, and further the photoresist pattern is removed by an organic solvent or the like to form the lower-layer coil portion. A wire bonding pad made of Au is formed on an end portion of the conductive portion. Thereafter, the lower-layer coil portion is cut into a plurality of chips by a slicer. The chip size is 2.3 mm×1.2 mm.

FIG. 18 shows the thin-film MI sensor 54 using two thin-film MI magnetic cores 55. Alternatively, as shown in FIG. 19, three thin-film MI magnetic cores 55 are disposed in parallel to constitute the thin-film MI sensor 54, or as shown in FIG. 20, four of more of the thin-film MI magnetic cores 55 are disposed in parallel to constitute the thin-film MI sensor 54.

Figure 19:
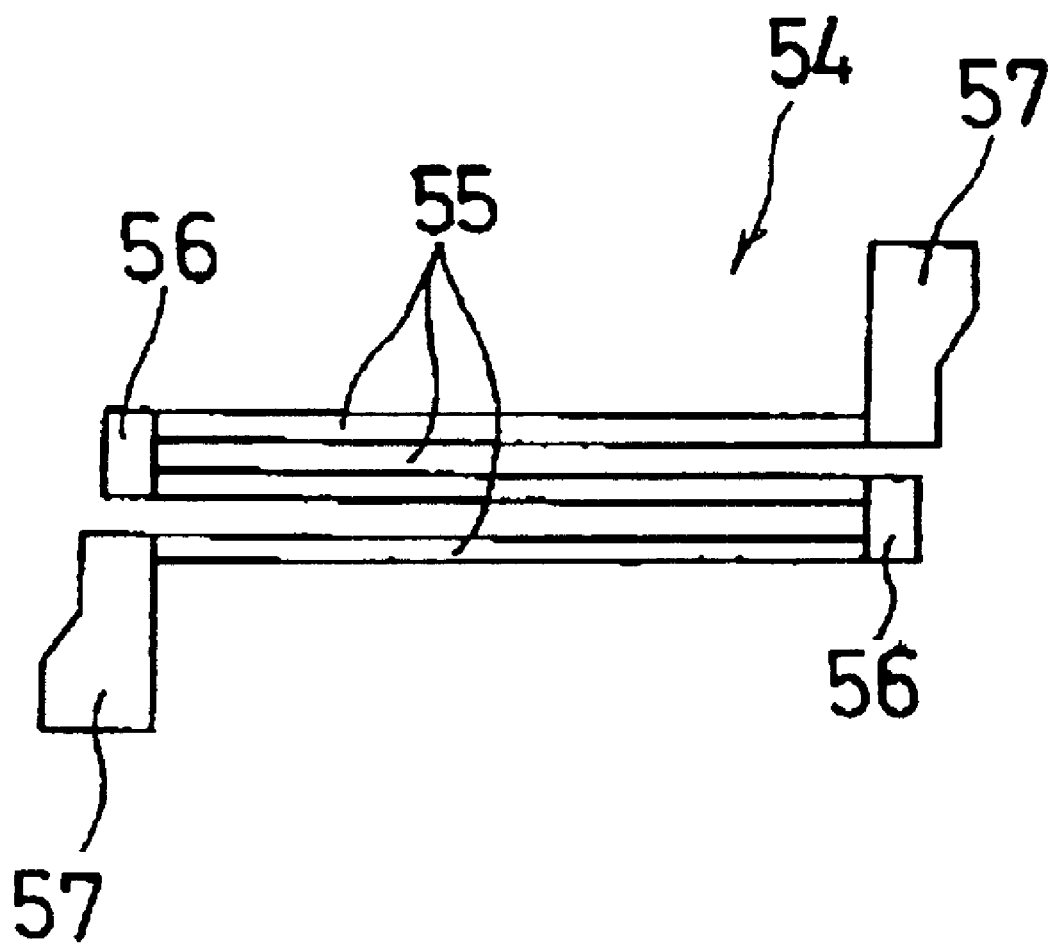
FIG. 19 is a plan view showing the main portion of the magnetic impedance element using three thin-film MI cores from which a coil and an insulating film are removed.
Figure 20:
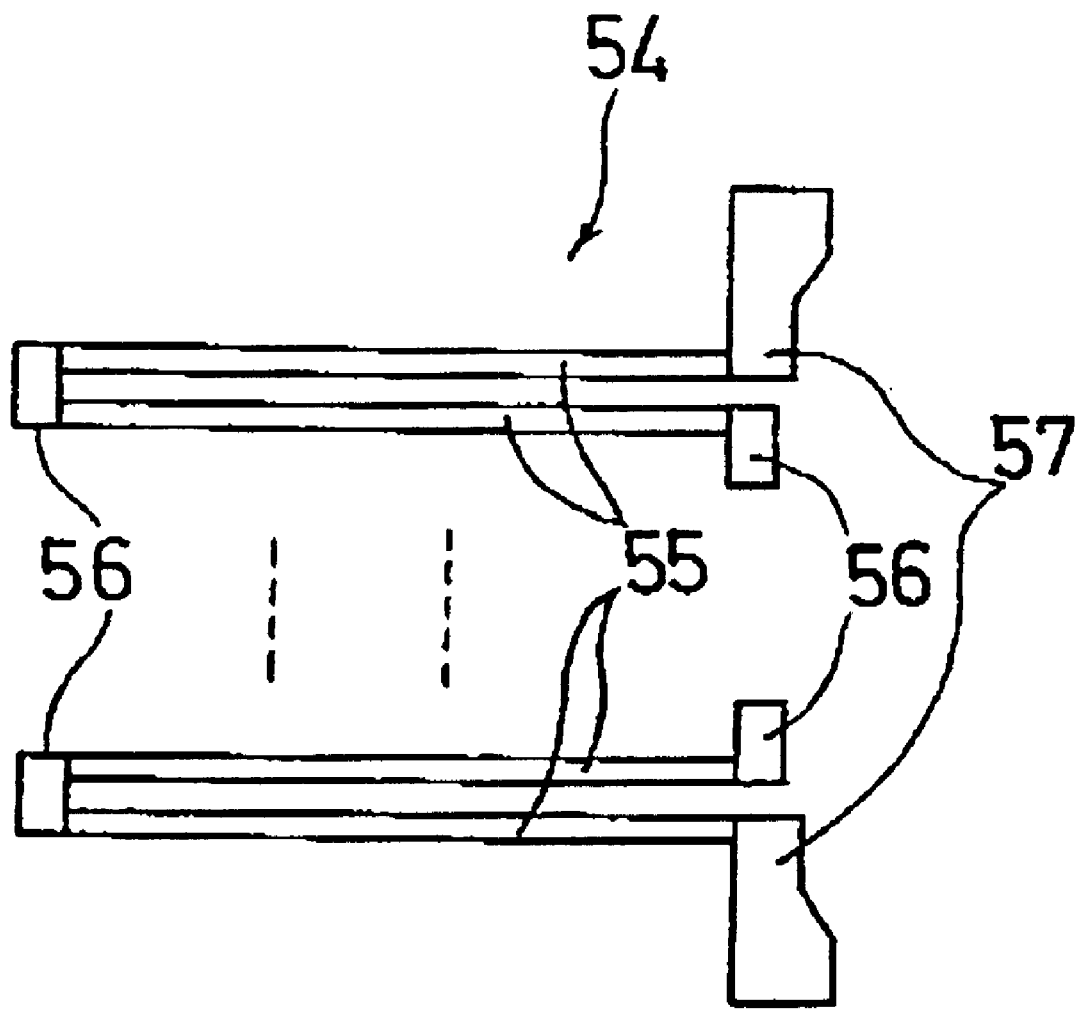
FIG. 20 is a plan view showing the main portion of the magnetic impedance element using four of more of the thin-film MI cores from which a coil and an insulating film are removed.

In FIGS. 19 and 20, an interval between the thin-film MI magnetic cores 55 disposed in parallel is 20 µm and the respective thin-film MI magnetic cores 55 are electrically coupled in series with each other by a non-magnetic conductor 56 made of Cu or the like. Incidentally, when three or more elements (thin-film MI magnetic cores 55) are closely disposed in parallel, there is a fear that an element (thin-film MI magnetic core 55) positioned at the outermost side and an element (thin-film MI magnetic core 55) positioned at the innermost side magnetically interfere with each other, as a result of which a magnetic field is not uniformly applied to the respective elements.

FIG. 21 is a graph showing a difference in magnetic flux between the outer element and the inner element when a magnetic field is uniformly applied to the respective elements in a state where three elements (thin-film MI magnetic cores 55) are disposed in parallel. In the figure, the magnetic flux density of the inner element to the outer element is represented by % when the intervals between the respective elements are changed. As the interval between the respective elements is narrower, an influence of interference is found. However, the difference in magnetic flux between the outer and inner elements is about 3% even when the interval is 5 µm, for example, which does not almost cause any problem.

Figure 22:
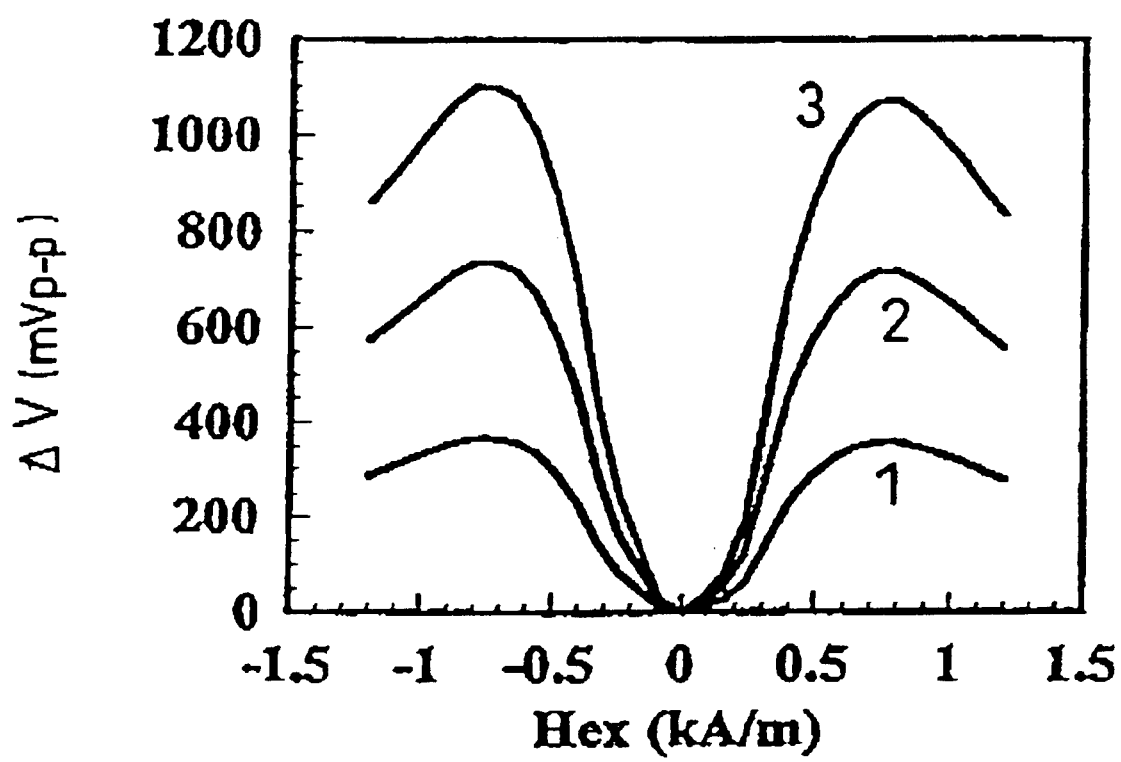
FIG. 22 is a graph showing the magnetic field-to-impedance characteristic of the magnetic impedance element when the number of the thin-film MI magnetic core is one, two and three.

FIG. 22 shows the magnetic field-impedance characteristic of the thin-film MI sensor 54 (FIG. 8) in which two thin-film MI magnetic cores 55 are disposed in parallel, and the respective thin-film MI magnetic cores 55 are electrically connected in series with each other, and the thin-film MI sensor 54 (FIG. 19) in which three thin-film MI magnetic cores 55 are disposed in parallel, and the respective thin-film MI magnetic cores 55 are electrically connected in series with each other. In this case, the measured current is a sine wave of 20 MHz and 40 mAp-p. FIG. 22 also shows the characteristic in case of one thin-film MI magnetic core 55 for comparison. The output value of the thin-film MI sensor 54 in which two or three thin-film MI magnetic cores 55 were connected in series was twice or three times as large as that in case of one thin-film MI magnetic core 55.

Subsequently, the above second embodiment of the present invention will be described with reference to FIGS. 23 to 26.

Figure 23:
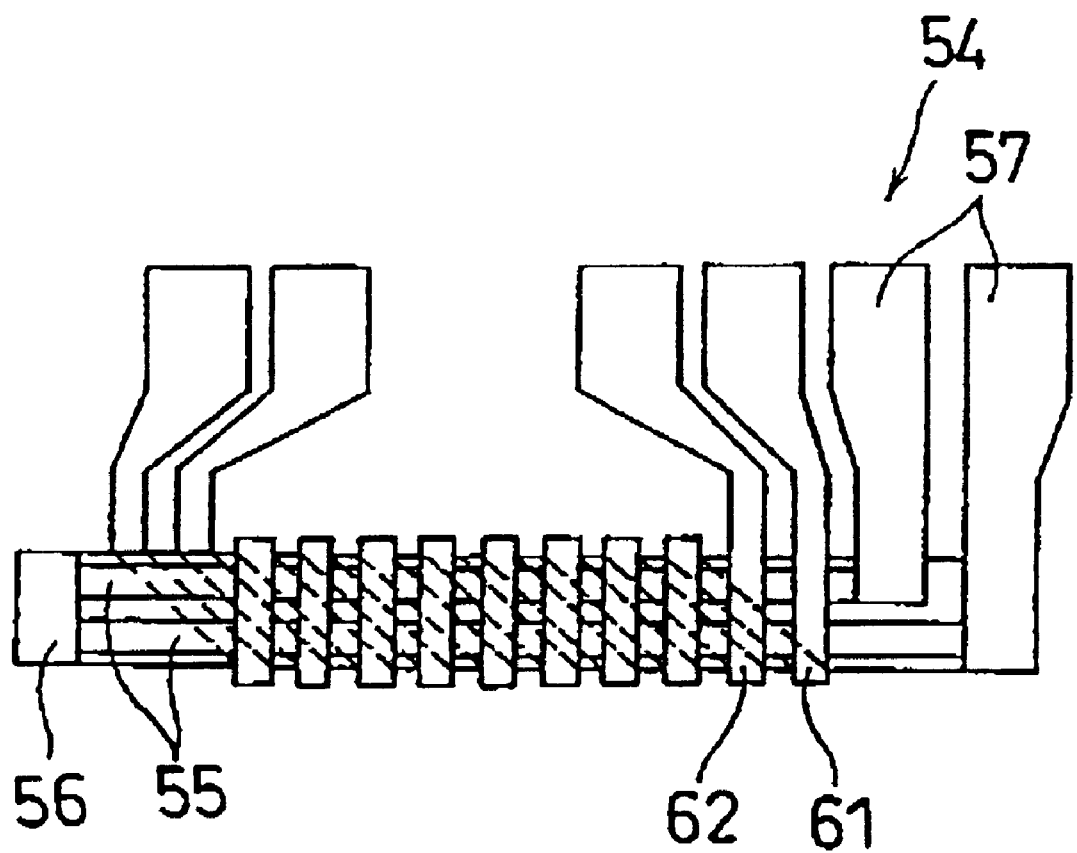
FIG. 23 is a plan view showing the arrangement of other elements from which an insulating film is omitted in another embodiment of the present invention.

FIG. 23 is a plan view showing the arrangement of elements other than the insulating film in the structure of the thin-film MI sensor 54 according to the prevent invention.

The configuration of the thin-film MI magnetic core 55 in the thin-film MI sensor 54 is 20 µm in width, 3 µm in thickness and 2000 µm in length, and the bias thin-film coil 61 and the negative feedback thin-film coil 62 are wound around the thin-film magnetic core (thin-film MI magnetic core 55) through the insulating film 60 three-dimensionally. The bias thin-film coil 61 and the negative feedback thin-film coil 62 are alternately wound, and the number of turns is 42, respectively. Also, an Au pad for wire bonding is provided on a part of the respective electrode portions.

FIGS. 24A to 24E show a process of manufacturing the thin-film MI sensor 54 which is represented by a cross-sectional view of FIG. 23 along the longitudinal direction thereof. Then, the detailed structure and the manufacturing process of the thin-film MI sensor 54 will be described with reference to FIGS. 24A to 24E.

The thin-film process of FIG. 24A to 24E is made In the order to manufacture the thin-film MI sensor 54.

Figure 24A:
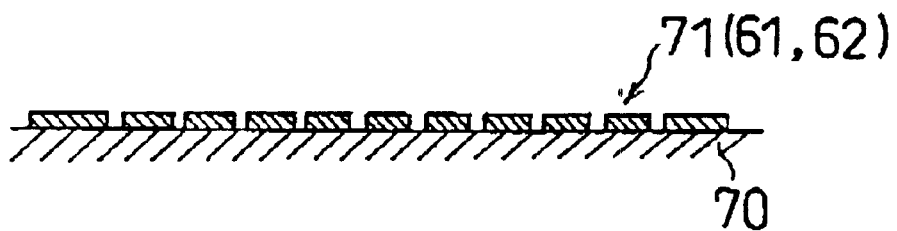
FIGS. 24A to 24E are diagrams showing a process of manufacturing a thin-film MI sensor.
Figure 24B:
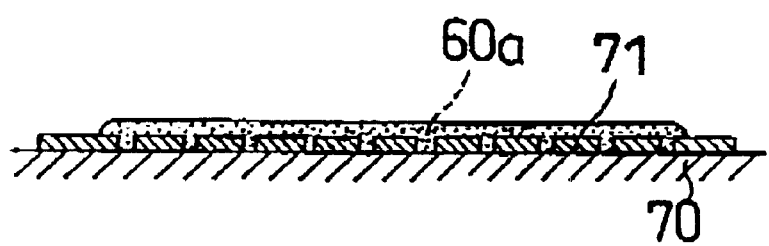
Figure 24C:
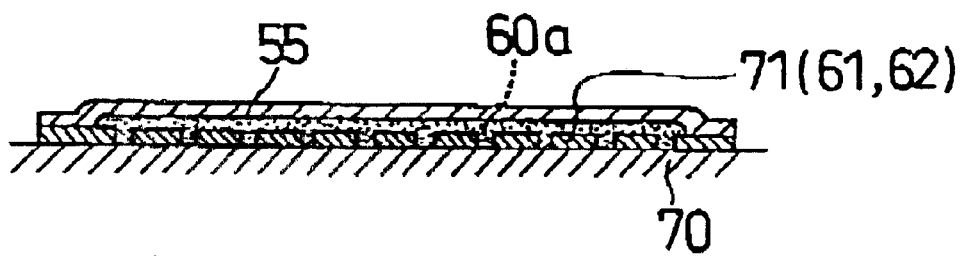
Figure 24D:
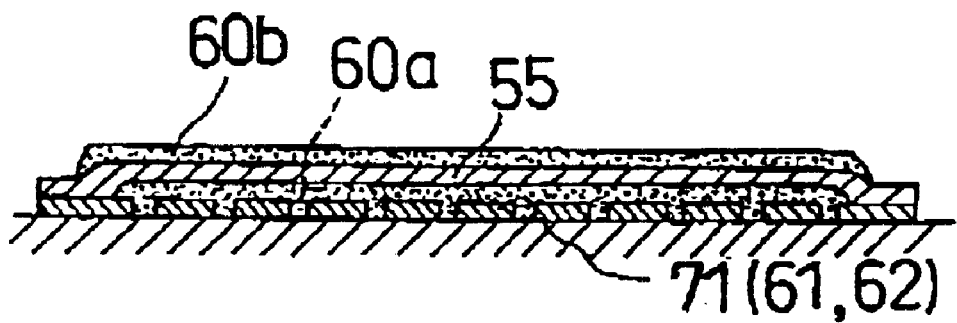
Figure 24E:
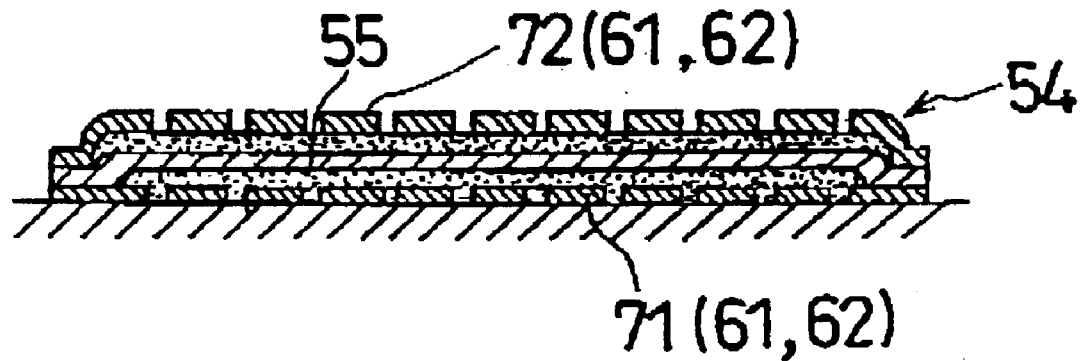

FIG. 24A shows the coil lower-layer portion (lower layer coil portion 71) that constitutes the bias thin-film coil 61 and the negative feedback thin-film coil 62, in which the end portions of the respective coil portions are connected to the coil end portions of the coil upper-layer portions 72 shown in FIG. 24E to constitute the continuous bias thin-film coil-61 and negative feedback thin-film coil 62.

The lower-layer coil portion 71 is formed on the non-magnetic substrate 70 having the enhanced surface flatness which is formed of an A1203 ceramic wafer, an Si wafer, a glass wafer or the like to form the Cu sputter film about 50 nm in thickness as a seed layer for plating. Then, after a photoresist pattern of the reverse pattern having a given coil configuration has been formed on the seed layer, a Cu plating is embedded in thickness of about 3 µm into the photoresist pattern, and further after the photoresist pattern has been removed by an organic solvent or the like, the seed layer of the Cu sputter film is removed by etching to form the thin-film MI element. On the other hand the Cu sputter film is formed in thickness of about 3 µm, and a photoresist pattern having a given coil configuration is then formed thereon. Thereafter, the Cu sputter film is etched by etching means such as ion mealing with the photoresist pattern as an etching mask, and further the photoresist pattern is removed by an organic solvent or the like to form the lower-layer coil portion 71.

The above method of preparing the Cu coil (bias thin-film coil 61 and negative feedback thin-film coil 62) enables the coil per se to be miniaturized and enables the coil to approach the magnetic core (thin-film MI magnetic core 55), thereby allowing the coil efficiency to be enhanced as compared with a method of preparing a coil by winding a conductive wire and a method of preparing a coil by winding a conductive thin band.

Reference numeral 60a in FIG. 24B is an insulating film for electrically insulating the lower-layer coil portion and the thin-film magnetic core. The insulating film 60a results from subjecting the insulating film 60a to a heat treatment at 270° C. for 10 hours for hardening after exposure and development processes are conducted on a photoresist to form the insulating film 60a having a given configuration. Alternatively, a resin such as polyimide which has been hardened or an inorganic film such as $SiO_2$ which has been formed in a given configuration may be employed.

Reference numeral 55 in FIG. 24C denotes the thin-film MI magnetic core which is formed of a plating film (soft magnetic film) made of at least one material selected from a group consisting of NiFe, CoFe, NiFeP, FeNiP, FeCoP, FeNiCoP, CoB, NiCoB, FeNiCoB, FeCoB and CoFe. The thin-film MI magnetic core 55 may be formed of an amorphous sputter film (soft magnetic film) made of any one of CoZrNb, FeSiB and CoSiB, or an NiFe sputter film (soft magnetic film).

Now, a manufacturing example in which the NiFe plating film is used as the thin-film MI magnetic core 55 will be described. First, an NiFe sputter film having a thickness of about 50 nm is formed as a seed layer for plating. A photoresist pattern of the reverse pattern having a given coil configuration is formed on the seed layer, and thereafter an NiFe plating is embedded in thickness of about 3 μm into the photoresist pattern. Then, after the photoresist pattern is removed by an organic solvent or the like, the seed layer of the NiFe sputter film is removed by etching to form the thin-film magnetic core. The thin-film magnetic core is manufactured through the same process even when a CoFeNi plating film is used as a thin-film MI magnetic core 55. The magnetic characteristics are improved if the magnetic impedance element is subjected to a heat treatment during the rotating magnetic field and the static magnetic field after the thin-film MI magnetic core 55 has been manufactured.

Subsequently, a manufacturing process in which a soft magnetic film such as an amorphous sputter film made of CoZrNb, FeSiB, CoFeB, or the like or an NiFe sputter film is used as the thin-film MI magnetic core 55 will be described. For example, a lower-layer coil portion 71 may be manufactured In the following manner. That is, the CoZrNb sputter film is formed in thickness of about 3 μm, and thereafter a photoresist pattern having a given magnetic core configuration is formed on the sputter film. The sputter film is etched by etching means such as ion mealing with the photoresist pattern as an etching mask, and further the photoresist pattern is removed by an organic solvent or the like to form the lower-layer coil portion 71. on the other hand, there is a metal mask method in which the reverse configuration of a given thin-film MI magnetic core 55 is manufactured in a thin metal plate and used as a sputter mask. However, this method is not preferred because it is difficult to obtain a magnetic core having a fine configuration, and the dimensional accuracy is low.

Reference numeral 60b in FIG. 24D denotes an insulating film for electrically insulating the upper-layer coil portion (coil upper-layer portion 72) and the thin-film MI magnetic core 55. The manufacturing method of the insulating film is the sama as that in case of the insulating film 60a shown in FIG. 24B.

FIG. 24E shows the coil upper-layer portion 72 that constitutes the bias thin-film coil 61 and the negative feedback thin-film coil 62, in which. as described with reference to FIG. 24A, the end portions of the respective coil portions are connected to the coil end portions of the coil lower-layer portions (lower layer coil portions 71) shown in FIG. 24A to constitute the continuous bias thin-film coil 61 and negative feedback thin-film coil 62. The manufacturing method is the same as that in case of the coil shown in FIG. 24A.

Finally, although being not shown, a protective layer that protects the manufactured magnetic sensor portion and a bonding pad for wire bonding for obtaining electric connection between peripheral circuits for driving and sensing the magnetic sensor is manufactured. The protective layer results from subjecting the protective film to a heat treatment at 270° C. for 10 hours for hardening after exposure and development processes are conducted on a photoresist to form the insulating film 60a having a given configuration. Alternatively, a resin such as polyimide which has been hardened or an inorganic film such as $SiO_2$ which has been formed in a given configuration may be employed. The Au pad for wire bonding which is provided on one part of the electrode portion is formed of an Au plating film or an Au sputter film. The manufacturing method is nearly the same as that in case of the Cu coil.

Then, the characteristic of the manufactured thin-film MI sensor 54 will be described. In this example, the dimensions of the thin-film MI magnetic core 55 are 20 μm in width, 3 μm in thickness and 2000 μm in length, and two thin-film MI magnetic cores 55 are connected in series. The chip size of the element is 2.3 mm×0.8 mm. Also, the bias thin-film coil 61 and the negative feedback thin-film coil 62 are alternately wound on the same surface, and the number of turns is 42, respectively. With the structure in which the bias thin-film coil 61 and the negative feedback thin-film coil 62 are alternately wound around the thin-film MI magnetic core 55 on the same surface, a bias magnetic field and a negative feedback magnetic field can be uniformly applied to the respective portions of the thin-film MI magnetic core 55, to thereby stabilize the characteristic as the magnetic sensor (thin-film MI sensor 54).

Figure 25:
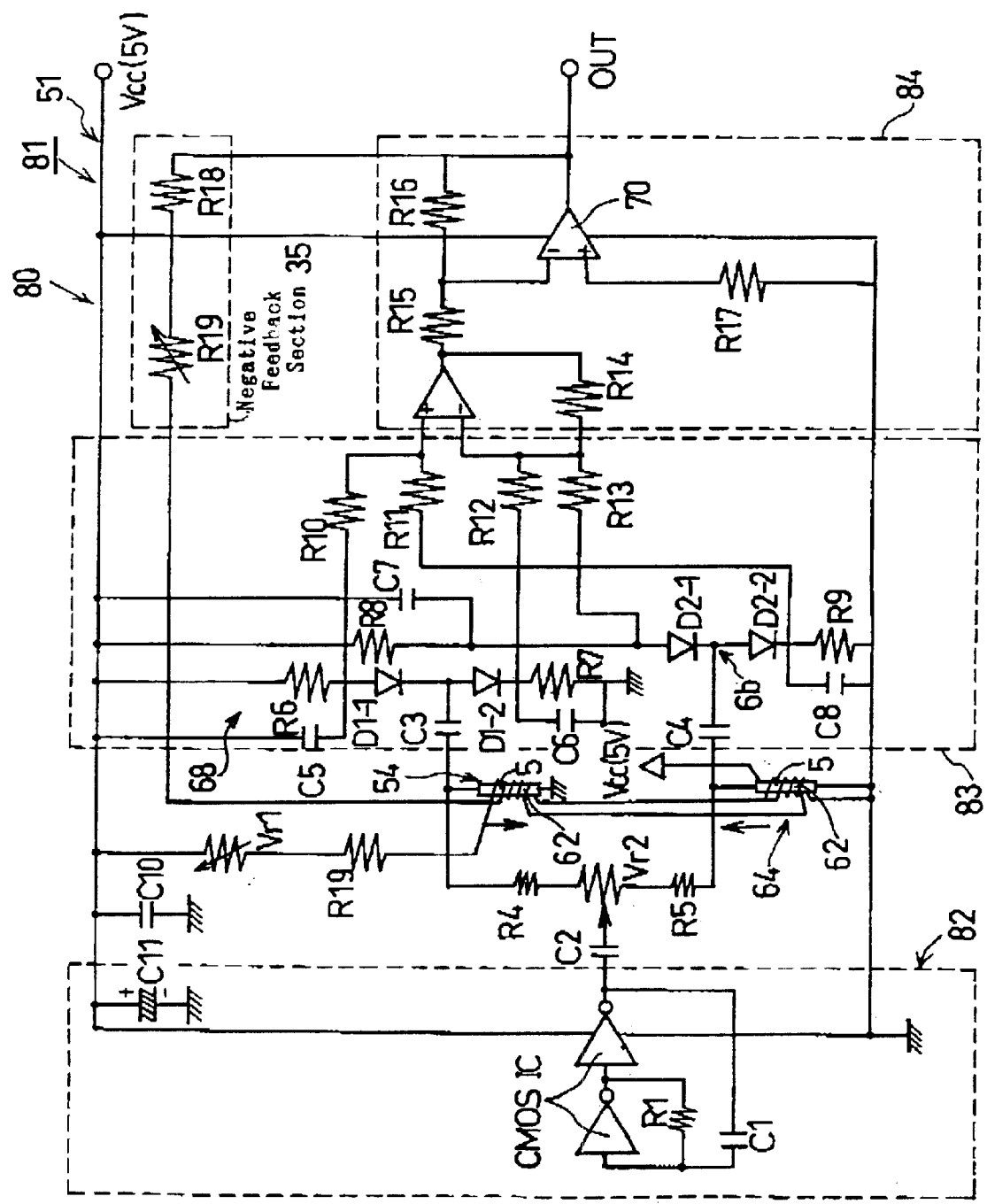
FIG. 25 is a circuit diagram showing a magnetic field detection magnetic sensor formed of two thin-film MI sensors shown in FIG. 1.

A magnetic field detection magnetic sensor 81 is structured such that two thin-film MI sensors 54 shown in FIG. 23 are so disposed as to enable differential drive, and the magnetic sensor circuit system is made up of a differential drive circuit 80 shown in FIG. 25. The magnetic field detection magnetic sensor 81 includes an oscillating circuit portion 82 that supplies a high-frequency current to those two thin-film MI sensors 54. The differential drive circuit 80 is made up of a detecting circuit section 83 having a detector (reference omitted) consisting of diodes D1-1, D1-2, D2-1, D2-2 and so on, and an amplifier section 84 that differentially amplifies a signal from the detecting circuit section 83 to output the amplified signal. The output section of the amplifier section 84 and the negative feedback thin-film coil 62 are connected to each other through the negative feedback section 85 in such a manner that the output signal from the amplifier section 84 is negatively fed back to the negative feedback thin-film coil 62.

FIG. 26 shows a relation of the output voltage of the sensor (magnetic field detection magnetic sensor 81) to the applied magnetic field when a negative feedback 240 A/m in bias coil magnetic field and 40% in negative feedback ratio is effected using the magnetic field detection magnetic sensor 81. In this example, the supply current is of a pulse wave having 5 ns pulse width, the pulse current is 35 mA and the amplification degree of the output is 25 times. As shown in the figure, the output when two magnetic cores (thin-film MI magnetic core 55) are disposed in parallel and connected in series is twice as large as that in case of one magnetic core (thin-film MI magnetic core 55) measured as comparison. Likewise, the output when three magnetic cores (thin-film MI magnetic core 55) are disposed in parallel and connected in series is three times as large as that in case of one magnetic core (thin-film MI magnetic core 55). The chip size is 2.3 mm×1.2 mm which is identical with the chip size of one magnetic core.

The sensor characteristic exhibits the linearity excellent within the measured magnetic field of ±80 A/m and exhibits the magnetic field resolution of $10^{-3}$ A/m. Those results exhibit the excellent characteristic as the linear magnetic field sensor. Also, in case of the element using a negative feedback coil in which a copper wire is wound around an amorphous wire, in order to obtain the same linearity as that of FIG. 26, a negative feedback of about 300% must be effected. The reason that the thin-film coil has the same linearity as that of the negative feedback coil where the copper wire is wound around the amorphous wire with the negative feedback ratio of about ⅙ is that the coil is allowed to approach the magnetic core (thin-film MI magnetic core 55) with the result that the coil efficiency of the thin-film coil is enhanced as described with reference to the bias coil.

Further, another embodiment of the present invention will be described with reference to the attached drawings.

FIG. 27 is a plan view schematically showing the structure of a thin-film magnetic impedance sensor (thin-film MI sensor 103) which is an example of the magnetic impedance element according to the present invention.

The thin-film MI sensor 103 has two thin-film magnetic cores 1 shown in FIG. 11. The dimensions of one thin-film magnetic core 104 are 20 μm in width, 3 μm in thickness and 2000 μm in length. Although the structure of one thin-film magnetic core 104 is identical with that shown in FIG. 11, the bias thin-film coil 105 (thin-film bias coil) and the negative feedback thin-film coil 106 (thin-film feedback coil) constitute one thin-film MI element 103a in cooperation with a common substrate (corresponding to the non-magnetic substrate 70 in FIG. 24). The number of turns of the bias thin-film coil 105 and the negative feedback thin-film coil 106 is 42, respectively. Two thin-film MI elements 103a structured as described above are disposed on the common substrate not shown so as to form one chip (in other words, one chip has the function of two magnetic impedance elements and constitutes a compound magnetic impedance element.), and the dimensions of the chip are 2.3 mm×1.6 mm.

Figure 28:
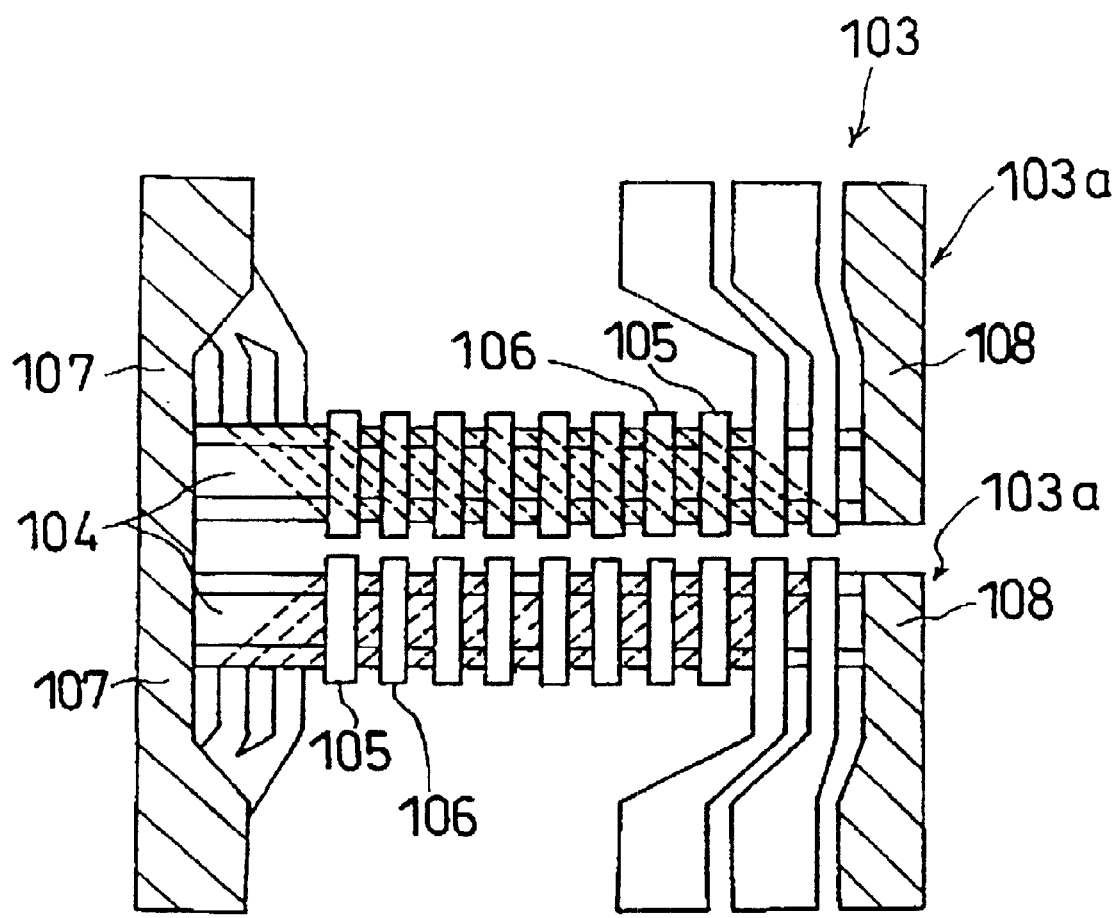
FIG. 28 is a plan view schematically showing a magnetic impedance element (thin-film MI sensor) with the structure where an earth terminal is commonly used.

A first electrode 107 and a second electrode 108 are disposed on both ends of the respective thin-film magnetic cores 104 in the longitudinal direction thereof so that a differential output may be extracted from the respective thin-film magnetic cores 104. Also, as is apparent from the above description of the thin-film MI sensor manufacturing process shown in FIG. 24, the bias thin-film coil 105 (thin-film bias coil) and the negative feedback thin-film coil 106 (thin-film negative feedback coil) are alternately wound on the same plane at a given interval through an insulating film 600 (insulator) in the same direction and as described above, the same number of turns. In the thin-film MI sensor 103 shown in FIG. 27, the first electrode 107 is grounded (that is, the first electrode 107 is set as an earth terminal). The thin-film MI sensor 103 shown in FIG. 28 is of the structure in which the earth terminals (first electrode 107, one terminal of the bias thin-film coil 105 and one terminal of the negative feedback thin-film coil 106) of the thin-film MI sensor 103 structured as shown in FIG. 27 are made common, whereby the number of terminals connected to the sensor drive circuit is reduced, thereby contributing to a reduction of the number of assembling steps.

Figure 29:
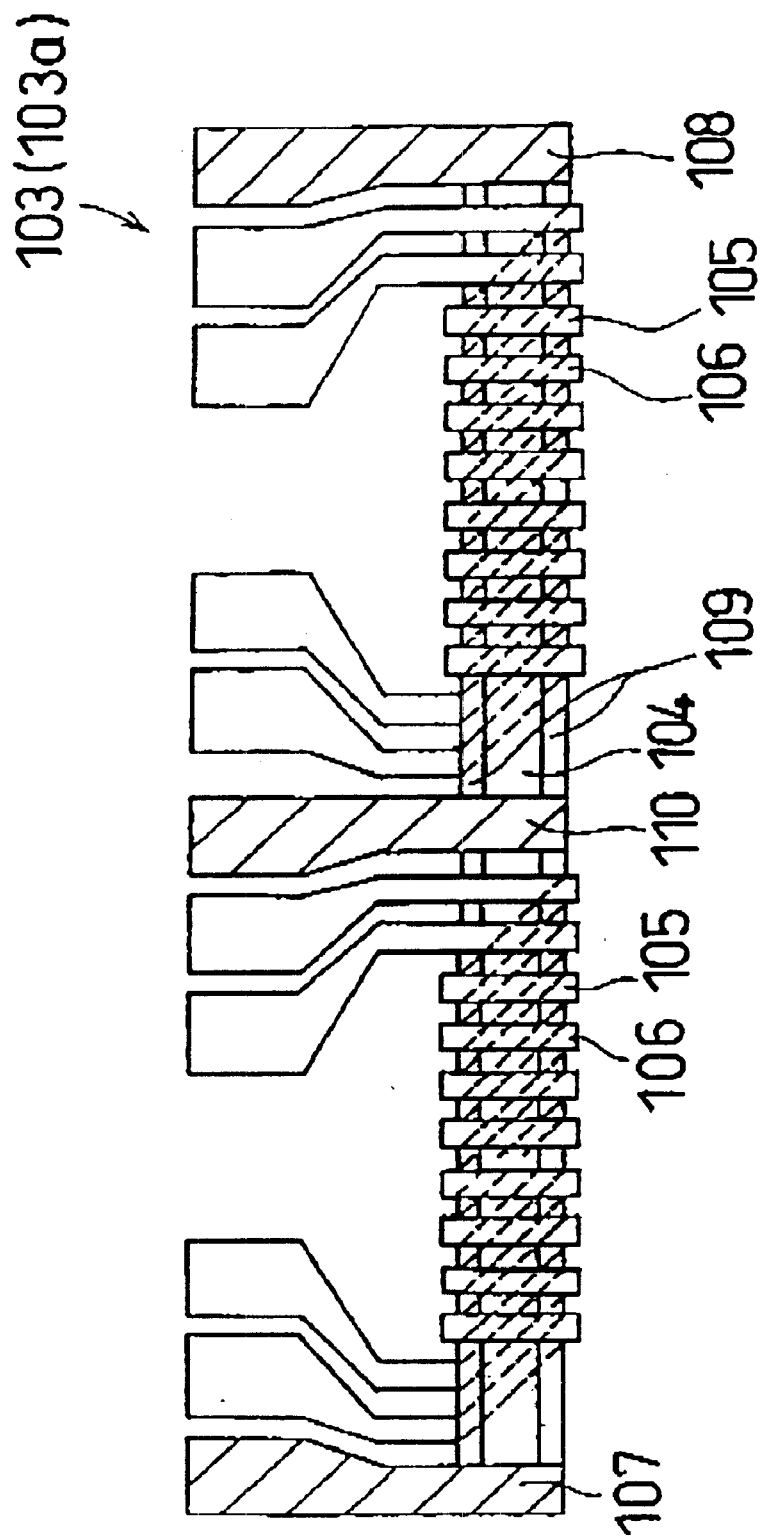
FIG. 29 is a plan view schematically showing a magnetic impedance element (thin-film MI sensor) in which a third electrode is disposed at the middle point of the thin-film magnetic core.

The thin-film MI sensor 103 shown in FIG. 29 is designed in such a manner that in the thin-film MI element 103a having the first electrode 107 and the second electrode 108 disposed on both ends of the thin-film magnetic core 104 in the longitudinal direction, a third electrode 110 is disposed at the middle point of the thin-film magnetic core 104, and the bias thin-film coil 105 and the negative feedback thin-film coil 106 (two bias thin-film coils 105 in total and two negative feedback thin-film coils 106 in total) are formed on a portion of the thin-film magnetic core 104 between the first electrode 107 and the third electrode 110 and formed on a portion of the thin-film magnetic core 104 between the second electrode 108 and the third electrode 110 through the insulating film 109, respectively. The bias thin-film coil 105 and the negative feedback thin-film coil 106 are alternately wound on the same plane at a given interval in the same direction and the same number of turns, respectively. The thin-film MI sensor 103 shown In FIG. 29 is structured so as to extract the differential output from the first electrode 107 and the second electrode 108.

The thin-film MI sensor 103 shown in FIG. 30 is of the structure in which the earth terminals (five terminals in total, that is, the third electrode 110, the right-side terminal of the bias thin-film coil 105 at the left side of FIG. 30, the left-side terminal of the bias thin-film coil 105 at the right side of FIG. 30, the right-side terminal of the negative feedback thin-film coil 106 at the left side of FIG. 30, the left-side terminal of the negative feedback thin-film coil 106 at the right side of FIG. 30) are made common, as a result of which the number of terminals connected to the sensor drive circuit is reduced, thereby contributing to a reduction of the number of assembling steps.

Figure 31:
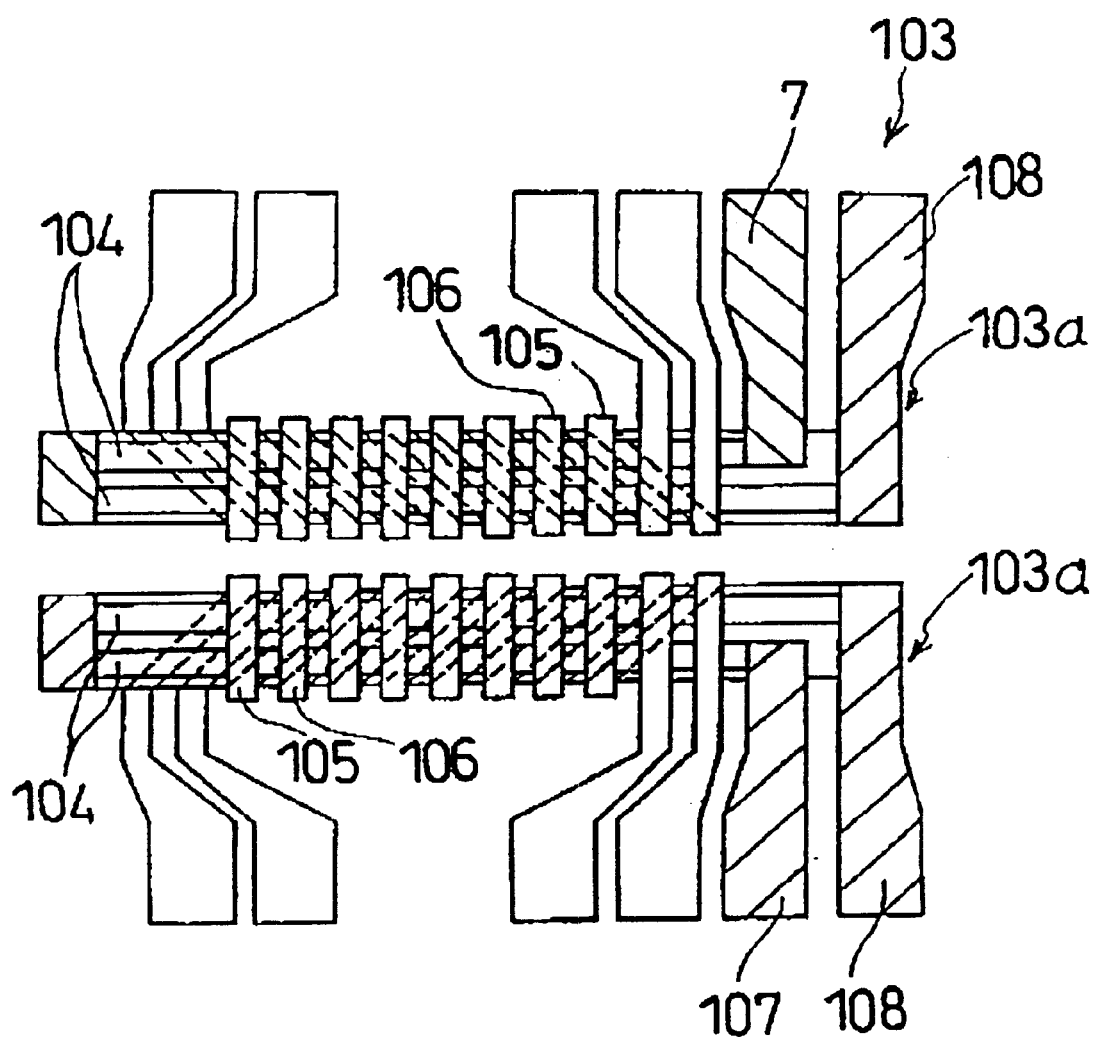
FIG. 31 is a plan view schematically showing a magnetic impedance element (thin-film MI sensor) in which each of two thin-film magnetic cores is made up of two thin-film magnetic cores.

Two thin-film MI sensor 103 shown in FIG. 31 (two upper and lower sensors in FIG. 30) are disposed in parallel on the non-magnetic substrate 70, and the respective thin-film magnetic cores 104 of the upper and lower thin-film MI elements 103a of FIG. 31 are made up of two thin-film magnetic core elements 104 which are disposed in parallel. Those two thin-film magnetic cores 104 of the upper thin-film MI elements 103a of FIG. 31 are electrically connected in series to each other, and likewise, those two thin-film magnetic cores 104 of the lower thin-film MI elements 103a of FIG. 31 are electrically connected in series to each other.

Subsequently, the characteristic of the thin-film MI sensor 103 manufactured with the structure shown in FIG. 27 will be described. In this example, the dimensions of one thin-film magnetic core 104 are 20 μm in width, 3 μm in thickness and 2000 μm in length as described above. Also, the bias thin-film coil 105 and the negative feedback thin-film coil 106 are alternately wound on the same surface as described above, and the number of turns is 42, respectively. With the structure in which the bias coil 105 and the negative feedback thin-film coil 106 are alternately wound around the thin-film magnetic core 104 on the same surface, a bias magnetic field and a negative feedback magnetic field can be uniformly applied to. the respective portions of the thin-film magnetic core 104, to thereby stabilize the characteristic as the magnetic sensor. The chip size of the entire element is 2.3 mm×1.6 mm, thus providing a very small-sized magnetic sensor.

Figure 32:
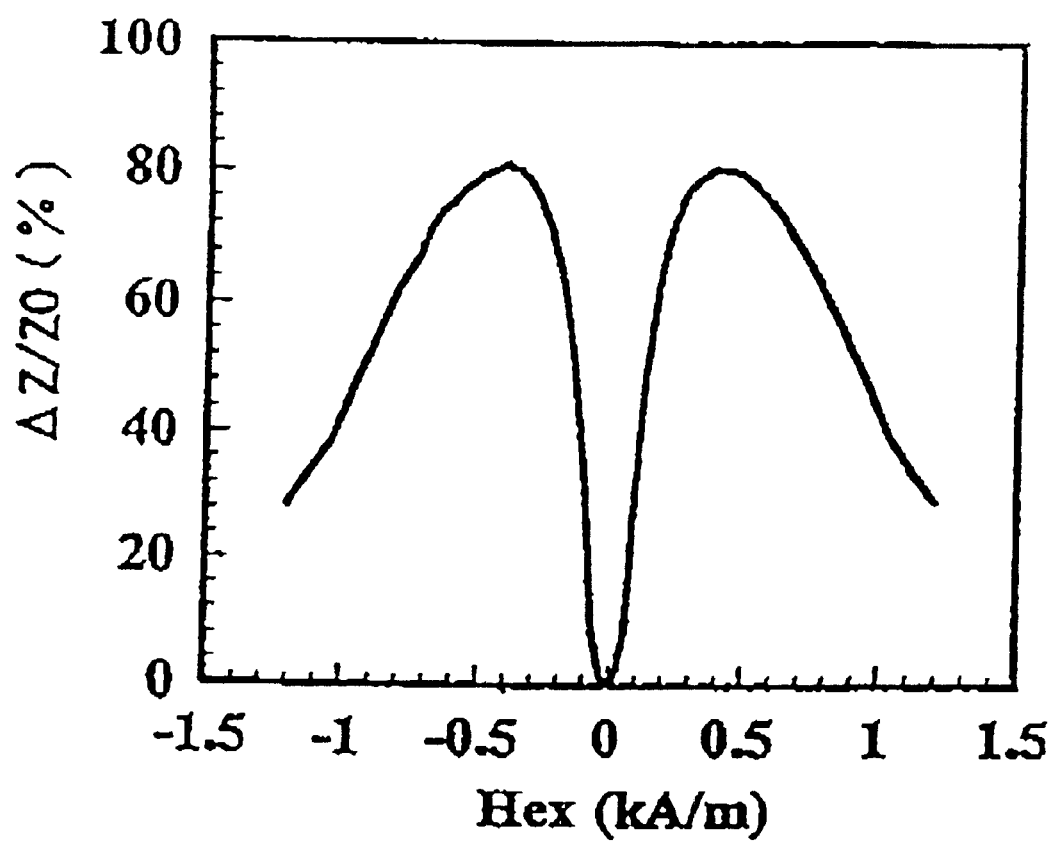
FIG. 32 is a graph showing the magnetic field-to-impedance characteristic of the magnetic impedance element shown in FIG. 27.

FIG. 32 shows the magnetic field to impedance characteristic of one thin-film magnetic core 104 when the supply current is a sine wave of 20 MHz and 20 mAp-p. As the applied magnetic field increases, the change rate $\Delta Z/Z0$ of the impedance increases and becomes maximum at the anisotropy magnetic field Hk of the element, and further when Hex>Hk, Z/Z0 becomes smaller. Also, the change amount (magnetic field sensitivity) of the impedance per unit applied magnetic field becomes maximum at about Hex=200 A/m and exhibits the magnetic field sensitivity of 0.4%/(A/m).

Figure 33:
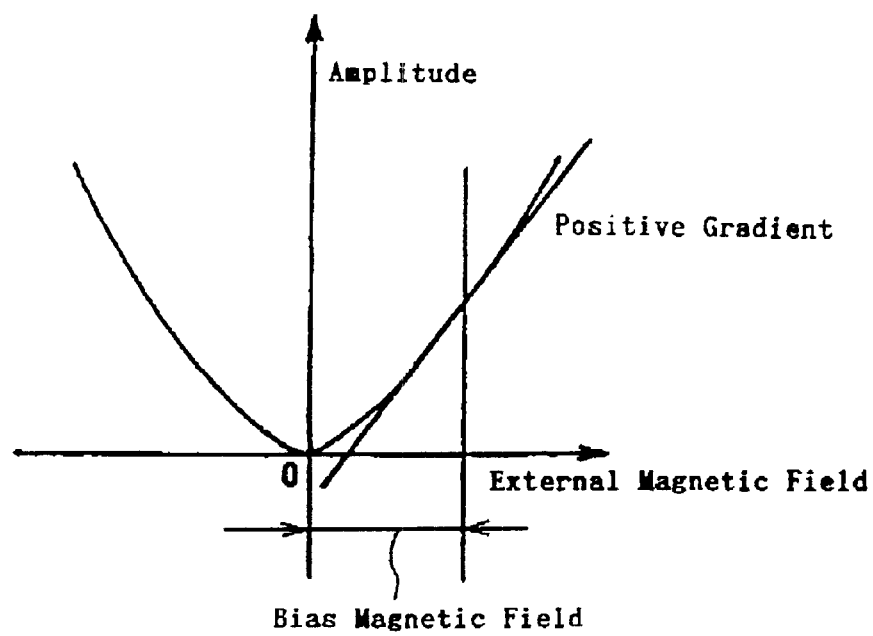
FIG. 33 is a graph showing the external magnetic field-to-amplitude characteristic when a positive bias magnetic field is applied to one of two MI elements (for example, the thin-film MI element on the upper side of FIG. 1)
Figure 34:
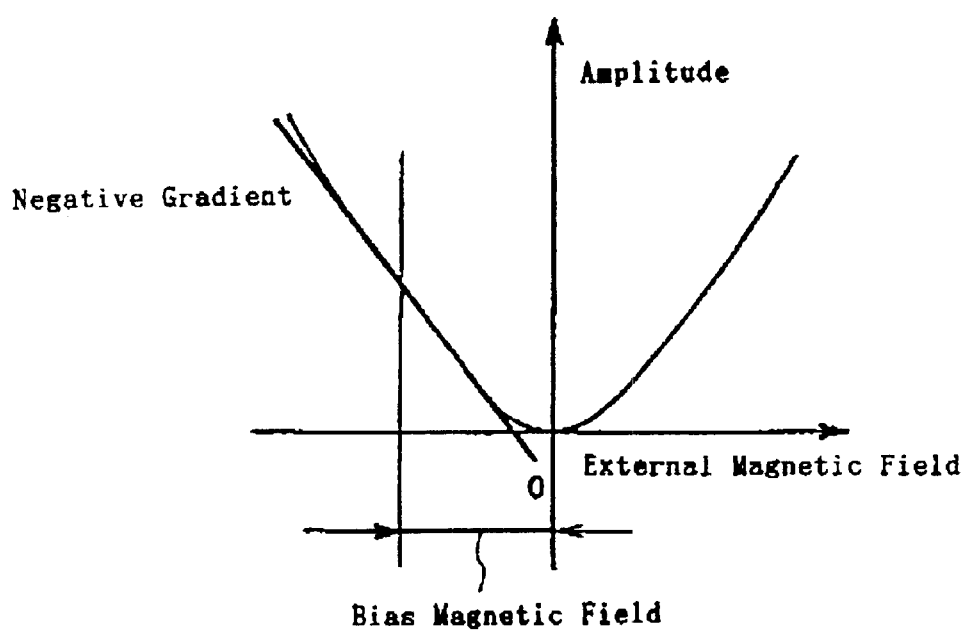
FIG. 34 is a graph showing the external magnetic field-to-amplitude characteristic when a positive bias magnetic field is applied to the other of two MI elements (for example, the thin-film MI element on the lower side of FIG. 1)

Subsequently, the drive principle of the differential drive type magnetic sensor using two magnetic MI elements (for example, the above thin-film MI elements 103a) will be described in brief with reference to FIGS. 33, 34 as well as FIG. 27. The differential drive type magnetic sensor circuit uses two magnetic MI elements (thin-film MI elements 106a) having the bias thin-film coil 105 and the negative feedback thin-film coil 106, and is made up of an oscillating circuit, a detecting circuit (diode bridge), an amplifying circuit and a negative feedback resistor. When a high-frequency current is applied to two magnetic MI elements (thin-film MI elements 103a) by the oscillator to apply an external magnetic field to those elements, the impedance of the elements (thin-film MI elements 103a and the thin-film magnetic core 104) varies. Opposite bias magnetic fields are applied to those two magnetic MI elements (thin-film MI elements 103a), respectively. For example, if a positive bias magnetic field is applied to one of the magnetic MI elements (for example, the upper thin-film MI element 103a in FIG. 1), a positive inclination is exhibited as shown in FIG. 33. Also, in this case, because a negative bias magnetic field is applied to the other magnetic MI element (for example, the lower thin-film MI elements 103a in FIG. 1), a negative inclination is exhibited as shown in FIG. 34. When those bias magnetic fields are detected and differentially detected by an operational amplifier, a change in the external magnetic field becomes a differential component. Therefore, the inclination of the magnetic sensor to which the outputs of two magnetic MI elements (thin-film MI elements 103a) are added appears, and a change in temperature of the magnetic MI elements (thin-film MI elements 103a) which is an in-phase component and so on can be removed.

The magnetic field detection magnetic sensor 81 is structured such that two thin-film MI elements shown in FIG. 27 are disposed so as to conduct differential drive, and the circuit system of the above-described magnetic sensor is used as the differential drive circuit 80 shown in FIG. 25.

Figure 35:
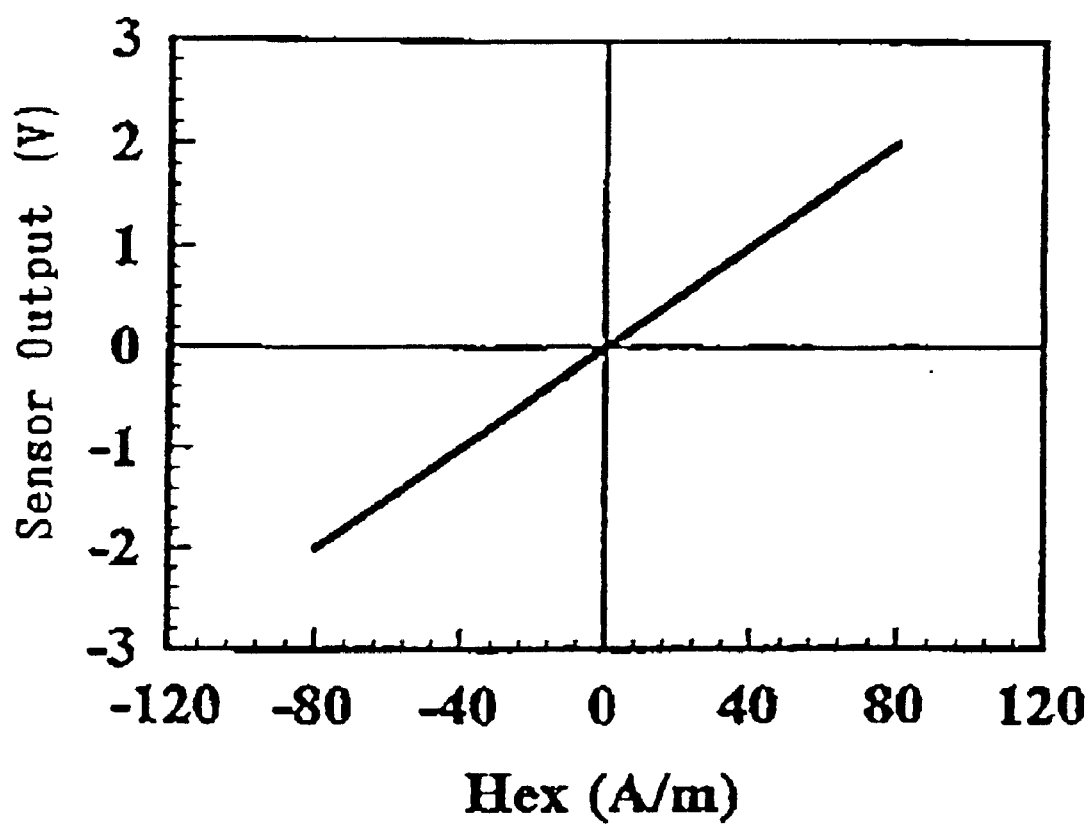
FIG. 35 is a graph showing the output voltage characteristic of the magnetic field detection magnetic sensor in accordance with the present invention.

FIG. 35 shows a relation of the output voltage of the sensor (magnetic field detection magnetic sensor 81) to the applied magnetic field when a negative feedback with 240 A/m in bias coil magnetic field and 40% in negative feedback ratio is effected using the magnetic field detection magnetic sensor 81 having the above circuit structure. In this example, the supply current is of a pulse wave with 5 ns in pulse width, the pulse current is 35 mA and the amplification degree of the output is 25 times.

The sensor characteristic exhibits excellent linearity within the measured magnetic field of ±80 (A/m), the output exhibits the high output of 25 mV/(A/m), and the magnetic field resolution of $10^{-3}$ (A/m) is exhibited. Also, as shown in FIG. 36, the temperature characteristic of the sensitive cnaracteristic exhibits the excellent characteristic of 0.1%/° C. Those results exhibit the excellent characteristic as the linear magnetic field sensor.

Also, in case of the element using a negative feedback coil in which a copper wire is wound around an amorphous wire, in order to obtain the same linearity as that of FIG. 35, a negative feedback of about 300% must be effected. The reason that the thin-film coils (bias thin-film coil 105 and negative feedback thin-film coil 106) have the same linearity as that of the negative feedback coil where the copper wire is wound around the amorphous wire with the negative feedback ratio of about ⅙ is that the coils (bias thin-film coil 105 and negative feedback thin-film coil 106) are allowed to approach the magnetic core (thin-film MI magnetic core 104) with the result that the coil efficiency of the thin-film coils (the bias thin-film coil 105 and negative feedback coil 106) is enhanced as described with reference to the bias coil.

Hereinbefore, although the embodiments of the present invention were described, various modifications and applications can be made within the subject of the present invention, and those modifications and applications are not intended to be removed from the scope of the present invention.

As was described in detail above, according to the first to ninth aspects of the present invention, in the thin-film magnetic impedance element, the non-magnetic film is inserted into the middle of the magnetic film to provide two layers of magnetic thin-films, as a result of which the magnetization vectors of the upper and lower magnetic films are coupled by the magnetrostatic coupling to keep them in a magnetic close state. With this state, the internal magnetization energy of the thin-film is minimized, and the thin-film having a two-layer structure is also structured by only 180° magnetic domain, whereby the MI effect becomes larger as compared with that of the single-layer film. For those reasons, the high-sensitive magnetic impedance elements can be provided.

According to the tenth, eleventh, seventeenth and eighteenth aspects of the present invention, at least two thin-film magnetic cores are disposed in parallel and the respective thin-film magnetic cores are electrically connected in series to each other. Accordingly, because the impedance of the magnetic impedance elements can be increased without Increasing the chip size of the elements, the magnetic sensor small in size and high in output can be obtained.

The thin-film bias coil and the thin-film negative feedback coil are formed on the thin-film magnetic core via an insulator, thereby being capable of miniaturizing and mass-producing the magnetic impedance element. Also, because the thin-film coil manufactured with the above structure is high in coil efficiency, a required bias magnetic field is obtained with a small current, and the linearity of the output to the magnetic field can be improved with the small negative feedback amount. For those reasons, the thin-film linear magnetic field sensor which is high in sensitivity, excellent in the linearity of sensitivity and excellent in the temperature characteristic can be provided. In addition, since the bias thin-film coil and the negative feedback thin-film coil are alternately wound, the bias magnetic field and the negative feedback magnetic field can be uniformly applied to the respective portions of the thin-film magnetic core, to thereby stabilize the characteristic as the magnetic sensor.

According to the twelfth to eighteenth aspects of the present invention, the differential type magnetic sensor can be manufactured with the entire size miniaturized. For that reason, since a uniform magnetic field can be applied to two magnetic impedance elements on the same non-magnetic substrate even when measuring a magnetic field occurring in a micro space, the uniform output can be differentially extracted from the respective magnetic impedance elements. In addition, as described above, the miniaturizing can lead to the improvement in mass production.

Further, in the above magnetic impedance element, with the structure where the respective one electrodes of the electrodes of the thin-film magnetic core, the electrodes of the thin-film bias thin-film coil and the electrodes of the thin-film negative feedback thin-film coils can be commonly connected to each other, the portions connected to the external circuits are reduced in number. As a result, the magnetic sensor which can reduce the number of steps for connection to the sensor drive circuit by means of the wire bonding or the like in a process of manufacturing the magnetic sensor and is high in reliability can be obtained.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A magnetic impedance element including a substrate made of a non-magnetic material and at least two thin-film magnetic cores formed on said substrate and having an electrode on a first end of each of said thin-film magnetic cores characterized in that said at least two thin-film magnetic cores are disposed in parallel and said respective thin-film magnetic cores are electrically connected in series to each other by non-magnetic conductor at a second end of each of said thin-film magnetic cores.

2. A magnetic impedance element as claimed in claim 1, wherein at least two of said thin-film magnetic cores have in common a thin-film bias coil and a thin-film negative feedback coil formed through an insulator, said thin-film bias coil and said thin-film negative feedback coil are alternately wound on a same plane at a given interval in a same direction and a same number of turns.

* * * * *